United States Patent
Schaefer et al.

(10) Patent No.: US 11,953,988 B2
(45) Date of Patent: Apr. 9, 2024

(54) ERROR CORRECTION MEMORY DEVICE WITH FAST DATA ACCESS

(71) Applicant: Micron Technology, Inc., Boise, ID (US)

(72) Inventors: Scott E Schaefer, Boise, ID (US); Aaron P. Boehm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 63 days.

(21) Appl. No.: 16/858,281

(22) Filed: Apr. 24, 2020

(65) Prior Publication Data

US 2020/0371873 A1 Nov. 26, 2020

Related U.S. Application Data

(60) Provisional application No. 62/851,800, filed on May 23, 2019.

(51) Int. Cl.
| | |
|---|---|
| *G06F 11/10* | (2006.01) |
| *G11C 11/22* | (2006.01) |
| *H03M 13/45* | (2006.01) |
| *G06F 3/06* | (2006.01) |

(Continued)

(52) U.S. Cl.
CPC ........ *G06F 11/1068* (2013.01); *G11C 11/221* (2013.01); *G11C 11/2273* (2013.01);
(Continued)

(58) Field of Classification Search
CPC ............. G06F 11/1068; G06F 11/1052; G06F 11/201; G06F 13/00; G06F 3/0659; G11C 11/4093; G11C 29/52; G11C 7/1006; G11C 11/221; G11C 11/2273; G11C 11/2275; H03M 13/6561; H03M 13/19; H03M 13/458

See application file for complete search history.

(56) References Cited

U.S. PATENT DOCUMENTS

| | | | | |
|---|---|---|---|---|
| 5,732,208 A | * | 3/1998 | Tamura ............... | G06F 11/1008 714/28 |
| 2004/0193967 A1 | * | 9/2004 | Nicolaidis .......... | G06F 11/1052 714/54 |

(Continued)

OTHER PUBLICATIONS

European Patent Office, "Extended Search Report," issued in connection with European Patent Application No. 20809775.8 dated Dec. 14, 2022 (7 pages).

*Primary Examiner* — April Y Blair
*Assistant Examiner* — Sazzad Hossain
(74) *Attorney, Agent, or Firm* — Holland & Hart LLP

(57) ABSTRACT

Methods, systems, and devices for a memory device with an error correction memory device with fast data access are described. For example, during a read operation, a memory device may be configured to output the data indicated by the read operation concurrent with performing an error correction operation. If the memory device detects an error, the memory device may indicate the error to a host device and, in some cases, output the corrected data to the host device. During a write operation, the memory device may store error detection or correction information associated with data to be stored at the memory device. The memory device may, in some cases, store error detection or correction information generated by the host device.

15 Claims, 11 Drawing Sheets

(51) Int. Cl.
*G06F 11/20* (2006.01)
*G06F 13/00* (2006.01)
*G11C 7/10* (2006.01)
*G11C 11/4093* (2006.01)
*G11C 29/52* (2006.01)
*H03M 13/00* (2006.01)
*H03M 13/19* (2006.01)

(52) U.S. Cl.
CPC ....... *G11C 11/2275* (2013.01); *H03M 13/458* (2013.01); *G06F 3/0659* (2013.01); *G06F 11/1052* (2013.01); *G06F 11/201* (2013.01); *G06F 13/00* (2013.01); *G11C 7/1006* (2013.01); *G11C 11/4093* (2013.01); *G11C 29/52* (2013.01); *H03M 13/19* (2013.01); *H03M 13/6561* (2013.01)

(56) References Cited

U.S. PATENT DOCUMENTS

| | | | |
|---|---|---|---|
| 2004/0250177 | A1 | 12/2004 | Bychkov et al. |
| 2005/0185492 | A1* | 8/2005 | Harrand ............... G11C 7/1057 365/230.05 |
| 2008/0082872 | A1 | 4/2008 | Nagasaka |
| 2010/0125772 | A1* | 5/2010 | Cheng ................. G06F 11/1068 714/E11.034 |
| 2011/0113313 | A1* | 5/2011 | Thiesfeld ................ G06F 11/10 714/E11.032 |
| 2015/0378823 | A1 | 12/2015 | Lesartre |
| 2017/0168893 | A1* | 6/2017 | Lin ..................... G06F 11/1012 |
| 2018/0060166 | A1* | 3/2018 | Lee ..................... G06F 11/1068 |

\* cited by examiner

ERROR CORRECTION MEMORY DEVICE WITH FAST DATA ACCESS

CROSS REFERENCE

The present Application for Patent claims the benefit of U.S. Provisional patent application Ser. No. 62/851,800 by SCHAEFER et al., entitled "ERROR CORRECTION MEMORY DEVICE WITH FAST DATA ACCESS," filed May 23, 2019, assigned to the assignee hereof, and expressly incorporated by reference herein.

BACKGROUND

The following relates generally to a system that includes at least one memory device and more specifically to an error correction memory device with fast data access.

Memory devices are widely used to store information in various electronic devices such as computers, wireless communication devices, cameras, digital displays, and the like. Information is stored by programming different states of a memory device. For example, binary devices most often store one of two states, often denoted by a logic 1 or a logic 0. In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

In some cases, data stored within a memory device may become corrupted. Some memory devices may be configured to internally correct such data corruption or errors (e.g., data errors) and thereby recover the data as stored before corruption. Such memory devices may be referred to as error-correcting code (ECC) memory or memory with on-die or inline ECC. Improved techniques for using ECC functionality within an ECC memory device may be desired. Improving memory devices, generally, may include increasing memory cell density, increasing read/write speeds, increasing reliability, increasing data integrity, reducing power consumption, or reducing manufacturing costs, among other metrics.

DETAILED DESCRIPTION

Figure 1:
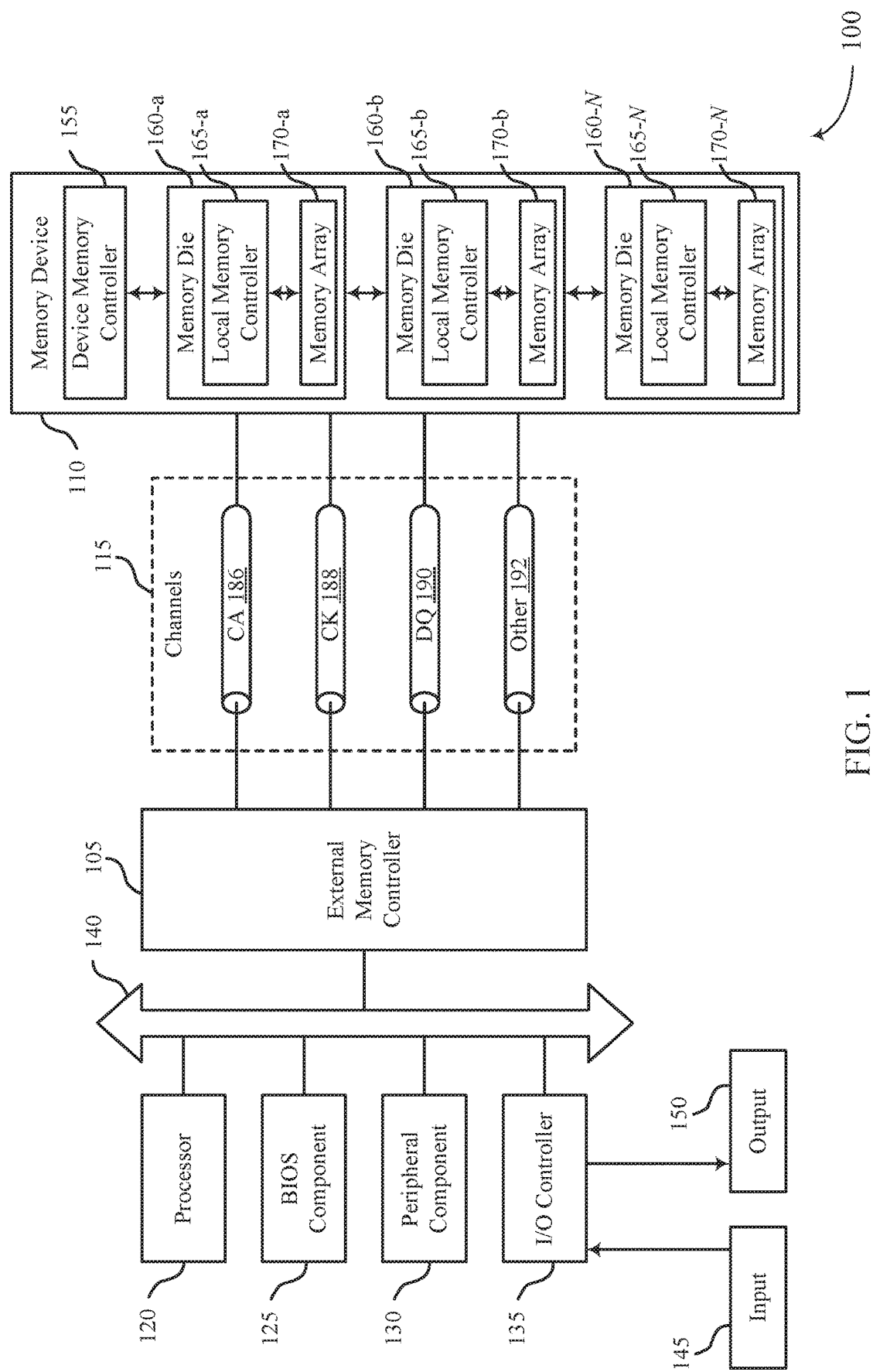
FIG. 1 illustrates an example of a system that supports an error correction memory device with fast data access in accordance with examples as disclosed herein.

Memory devices may operate under various conditions as part of electronic apparatuses such as personal computers, wireless communication devices, servers, internet-of-things (IoT) devices, electronic components of automotive vehicles, and the like. In some cases, memory devices supporting applications for certain implementations (e.g., automotive vehicles, in some cases with autonomous or semi-autonomous driving capabilities) may be subject to increased reliability constraints. As such, memory devices (e.g., DRAM) for some applications may be expected to operate with a reliability subject to relatively higher industry standards or specifications (e.g., higher reliability constraints).

Data stored in a memory device may in some cases become corrupted (e.g., due to leakage, parasitic coupling, or electromagnetic interference (EMI)). Corruption of data may refer to an unintentional change in the logic value of data as stored within the memory device and thus may refer to an unintended change in the logic value stored by one or more memory cells (e.g., from a logic one (1) to a logic zero (0), or vice versa). For example, a memory device may perform a read operation to determine the logic value of data stored within the memory device and one or more of the memory cells may have become corrupted. A deviation in the stored logic value of a bit from its original and intended logic value may be referred as an error, a bit error, or a data error and may result from corruption. Some memory devices may be configured to internally detect and in at least some cases correct (repair) such data corruption or errors and thereby recover the data as stored before corruption. Such error detection and correction may rely upon one or more error-correcting codes (ECCs) (e.g., block codes, convolutional codes, Hamming codes, low-density parity-check codes, turbo codes, polar codes), and related processes, operations. These techniques may be referred as ECC processes, ECC operations, ECC techniques, or in some cases as simply ECC or ECC. Error detection and correction conducted internally within a memory device on data stored previously at the memory device may generally be referred to as internal or on-die ECC (whether within a single-die memory device or a multi-die memory device), and memory devices that support internal or on-die ECC may be referred to as ECC memory or on-die ECC memory.

Additionally or alternatively, data transmitted to a memory device by a host device (e.g., during a write operation) may in some cases become corrupted (e.g., due to parasitic effects, electromagnetic interference, or inter-symbol interference). In some instances, if corruption occurs during a write operation. on-die ECC may not detect the error. A memory device may be configured to correct and/or detect such errors by relying upon error detection or correction information transmitted in addition to data from the host device (e.g., during a write operation). The memory device may also generate and transmit error detection or correction information in addition to data transmitted to the host device (e.g., during a read operation). Error detection and correction conducted on data transmitted between the memory device and the host device may be referred to as link-ECC.

Additionally or alternatively, a host device may generate ECC information and provide additional bits that contain the ECC information within the data (e.g., during a write operation). The host device may then check the data and ECC information (e.g., during a read operation). Using additional data bits to carry host-generated ECC information may be referred to as in-line ECC. The in-line ECC may check for channel errors (e.g., errors occurring at a channel between the memory device and the host device) and errors generated internally at the memory device data corruption at the memory device)). In some cases, in-line ECC may include error correction and detection at a higher granularity (e.g., more ECC information providing higher error correction and detection capability) than on-die ECC.

In some cases, performing error detection and correction operations in the memory device (e.g., on-die ECC) may add latency to access operations (e.g., a read operation, a write operation). For example, the error detection and correction operation may take several nanoseconds, and the corrected data may not be available until the internal on-die error detection and correction operation is complete. It may be desirable to decrease the latency associated with access operations. In one example, the memory device may bypass the internal error detection and correction operation and execute the access operation without using or generating corresponding error detection or correction information. But suppressing use of error detection or correction may decrease the reliability of data bits read from an array of the memory device.

Techniques for an error correction memory device with fast data access are described. The memory device may concurrently perform an internal error detection and correction operation while outputting data that bypasses the internal error detection and correction operation. Thus the internal error detection and correction operation may be performed on the data for increased reliability while the latency of access operations (e.g., read, write) is not impacted by the internal error detection and correction operation. In the event that an error is detected or corrected, the memory device may output an indication of the detected error. In some cases, the memory device may retroactively output corrected data (e.g., with or without the indication of the detected error). During a write operation, the memory device may store the data and some corresponding error correction and detection information generated by a host device. Here, the latency introduced by performing an error detection and correction operation at the memory device may be bypassed while still maintaining the reliability associated with storing error detection or correction information.

Features of the disclosure are initially described in the context of a memory system and memory die as described with reference to FIGS. 1-5. Features of the disclosure are then described in the context of process flows with reference to FIGS. 6 and 7. These and other features of the disclosure are further illustrated by and described with reference to apparatus diagrams and flowcharts in FIGS. 8-11 that relate to configurable error correction modes.

FIG. 1 illustrates an example of a system 100 that utilizes one or more memory devices in accordance with examples as disclosed herein. The system 100 may include an external memory controller 105, a memory device 110, and a plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. The memory device 110 may be component of the system configured to store data for one or more other components of the system 100. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the host device may refer to the hardware, firmware, software, or a combination thereof that implements the functions of the external memory controller 105. In some cases, the external memory controller 105 may be referred to as a host or host device. In some examples, system 100 is a graphics card.

In some cases, a memory device 110 may be an independent device or component that is configured to be in communication with other components of the system 100 and provide physical memory addresses/space to potentially be used or referenced by the system 100. A memory device 110 may be configurable to work with at least one or a plurality of different types of systems 100. Signaling between the components of the system 100 and the memory device 110 may be operable to support modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory dice 160 (e.g., memory chips) to support a desired or specified capacity for data storage. The memory device 110 including two or more memory dice may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), a general purpose GPU (GPGPU), or a system on a chip (SoC), among other examples.

The BIOS component 125 may be a software component that includes a BIOS operated as firmware, which may initialize and run various hardware components of the system 100. The BIOS component 125 may also manage data flow between the processor 120 and the various components of the system 100, e.g., the peripheral components 130, the I/O controller 135, etc. The BIOS component 125 may include a program or software stored in read-only memory (ROM), flash memory, or any other non-volatile memory.

The peripheral component(s) 130 may be any input device or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or specialized graphics ports. The peripheral component(s) 130 may be other components understood by those skilled in the art as peripherals.

The I/O controller 135 may manage data communication between the processor 120 and the peripheral component(s) 130, input devices 145, or output devices 150. The I/O controller 135 may manage peripherals that are not integrated into or with the system 100. In some cases, the I/O controller 135 may represent a physical connection or port to external peripheral components.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, and so forth. In some cases, the output 150 may be a peripheral that interfaces with the system 100 via one or more peripheral components 130 or may be managed by the I/O controller 135.

The components of system 100 may be made up of general-purpose or special purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. Each memory die 160 may include a local memory controller 165 (e.g., local memory controller 165-a, local memory controller 165-b, and/or local memory controller 165-N) and a memory array 170 (e.g., memory array 170-a, memory array 170-b, and/or memory array 170-N). A memory array 170 may be a collection (e.g., a grid) of memory cells, with each memory cell being configured to store at least one bit of digital data. Features of memory arrays 170 and/or memory cells are described in more detail with reference to FIG. 2.

The memory device 110 may be an example of a two-dimensional (2D) array of memory cells or may be an example of a three-dimensional (3D) array of memory cells. For example, a 2D memory device may include a single memory die 160. A 3D memory device may include two or more memory dice 160 (e.g., memory die 160-a, memory die 160-b, and/or any quantity of memory dice 160-N). In a 3D memory device, a plurality of memory dice 160-N may be stacked on top of one another or next to one another. In some cases, memory dice 160-N in a 3D memory device may be referred to as decks, levels, layers, or dies. A 3D memory device may include any quantity of stacked memory dice 160-N (e.g., two high, three high, four high, five high, six high, seven high, eight high). This may increase the quantity of memory cells that may be positioned on a substrate as compared with a single 2D memory device, which in turn may reduce production costs or increase the performance of the memory array, or both. In some 3D memory device, different decks may share at least one common access line such that some decks may share at least one of a word line, a digit line, and/or a plate line.

The device memory controller 155 may include circuits or components configured to control operation of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory dice 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die 160 to a component of the system 100 (e.g., the processor 120). In some cases, the device memory controller 155 may control operation of the memory device 110 described herein in conjunction with the local memory controller 165 of the memory die 160. Examples of the components included in the device memory controller 155 and/or the local memory controllers 165 may include receivers for demodulating signals received from the external memory controller 105, decoders for modulating and transmitting signals to the external memory controller 105, logic, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 as described herein. In some cases, the memory device 110 does not include the device memory controller 155, and the local memory controller 165 or the external memory controller 105 may perform the various functions described herein. As such, the local memory controller 165 may be configured to communicate with the device memory controller 155, with other local memory controllers 165, or directly with the external memory controller 105 or the processor 120.

The external memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While the external memory controller 105 is depicted as being external to the memory device 110, in some cases, the external memory controller 105, or its functions described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. The channels 115 may enable communications between the external memory controller 105 and the memory device 110. Each channel 115 may include one or more signal paths or transmission mediums (e.g., conductors) between terminals associated with the components of system 100. For example, a channel 115 may include a first terminal including one or more pins or pads at external memory controller 105 and one or more pins or pads at the memory device 110. A pin may be an example of a conductive input or output point of a device of the system 100, and a pin may be configured to act as part of a channel.

In some cases, a pin or pad of a terminal may be part of to a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory dice 160, local memory controllers 165, memory arrays 170).

Channels 115 (and associated signal paths and terminals) may be dedicated to communicating specific types of information. In some cases, a channel 115 may be an aggregated channel and thus may include multiple individual channels. For example, a data channel 190 may be x4 (e.g., including four signal paths), x8 (e.g., including eight signal paths), x16 (including sixteen signal paths), and so forth. Signals communicated over the channels may use double data rate (DDR) signaling. For example, some symbols of a signal may be registered on a rising edge of a clock signal and other symbols of the signal may be registered on a falling edge of the clock signal. Signals communicated over channels may use single data rate (SDR) signaling. For example, one symbol of the signal may be registered for each clock cycle.

In some cases, the channels 115 may include one or more command and address (CA) channels 186. The CA channels 186 may be configured to communicate commands between the external memory controller 105 and the memory device 110 including control information associated with the commands (e.g., address information). For example, the CA channel 186 may include a read command with an address of the desired data. In some cases, the CA channels 186 may be registered on a rising clock signal edge and/or a falling clock signal edge. In some cases, a CA channel 186 may include any quantity of signal paths to decode address and command data (e.g., eight or nine signal paths).

In some cases, the channels 115 may include one or more clock signal (CK) channels 188. The CK channels 188 may be configured to communicate one or more common clock signals between the external memory controller 105 and the memory device 110. Each clock signal may be configured to oscillate between a high state and a low state and coordinate the actions of the external memory controller 105 and the memory device 110. In some cases, the clock signal may be a differential output (e.g., a CK_t signal and a CK_c signal) and the signal paths of the CK channels 188 may be configured accordingly. In some cases, the clock signal may be single ended. A CK channel 188 may include any quantity of signal paths. In some cases, the clock signal CK (e.g., a CK_t signal and a CK_c signal) may provide a timing reference for command and addressing operations for the memory device 110, or other system-wide operations for the memory device 110. The clock signal CK therefore may be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated using a variety of different modulation schemes (e.g., NRZ, PAM4).

In some cases, error detection information associated with data of an access operation may be communicated using one or more of the channels 115. The memory device 110 may use the error detection information to detect or correct errors introduced into data as it is transmitted from a host device to the memory device 110. The error detection information may include ECC bits for detecting or correcting errors in the associated data. The ECC bits may be SEC ECC bits or SECDED ECC bits depending on a type of ECC being implemented by the system 100. In some other cases, the ECC bits may correspond to other types of ECC (e.g., other than SEC or SECDED ECC) being implemented by the system 100. An error detection process for error detection or correction in data communicated between the memory device 110 and the host device may be referred to as link ECC. The error detection information may be communicated over one or more of the other channels 192. The data may be communicated over a DQ channel 190 and the error detection information may be communicated during the same burst period. Additionally or alternatively, error detection information may be communicated over the DQ channels 190. Such error detection information may be referred to as rank error detection information. When using rank error detection, the external memory controller 105 and/or the memory device 110 may adjust the burst length of a burst of data to include both the data associated with the access operation and the error detection information associated with the data.

In some cases, the channels 115 may include one or more other channels 192 that may be dedicated to other purposes. These other channels 192 may include any quantity of signal paths.

In some cases, the other channels 192 may include one or more write clock signal (WCK) channels. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels may be configured to communicate a common data clock signal between the external memory controller 105 and the memory device 110. The data clock signal may be configured to coordinate an access operation (e.g., a write operation or read operation) of the external memory controller 105 and the memory device 110. In some cases, the write clock signal may be a differential output (e.g., a WCK_t signal and a WCK_c signal) and the signal paths of the WCK channels may be configured accordingly. A WCK channel may include any quantity of signal paths. The data clock signal WCK may be generated by a data clock, which may include one or more hardware components (e.g., oscillators, crystals, logic gates, transistors, or the like).

The channels 115 may couple the external memory controller 105 with the memory device 110 using a variety of different architectures. Examples of the various architectures may include a bus, a point-to-point connection, a crossbar, a high-density interposer such as a silicon interposer, or channels formed in an organic substrate or some combination thereof. For example, in some cases, the signal paths may at least partially include a high-density interposer, such as a silicon interposer or a glass interposer.

Signals communicated over the channels 115 may be modulated using a variety of different modulation schemes. In some cases, a binary-symbol (or binary-level) modulation scheme may be used to modulate signals communicated between the external memory controller 105 and the memory device 110. A binary-symbol modulation scheme may be an example of a M-ary modulation scheme where M is equal to two. Each symbol of a binary-symbol modulation scheme may be configured to represent one bit of digital data (e.g., a symbol may represent a logic 1 or a logic 0). Examples of binary-symbol modulation schemes include, but are not limited to, non-return-to-zero (NRZ), unipolar encoding, bipolar encoding, Manchester encoding, pulse amplitude modulation (PAM) having two symbols (e.g., PAM2), and/or others.

In some cases, a multi-symbol (or multi-level) modulation scheme may be used to modulate signals communicated between the external memory controller 105 and the memory device 110. A multi-symbol modulation scheme may be an example of a M-ary modulation scheme where M is greater than or equal to three. Each symbol of a multi-symbol modulation scheme may be configured to represent more than one bit of digital data (e.g., a symbol may represent a logic 00, a logic 01, a logic 10, or a logic 11). Examples of multi-symbol modulation schemes include, but are not limited to, PAM4, PAM8, etc., quadrature amplitude modulation (QAM), quadrature phase shift keying (QPSK), and/or others. A multi-symbol signal or a PAM4 signal may be a signal that is modulated using a modulation scheme that includes at least three levels to encode more than one bit of information. Multi-symbol modulation schemes and symbols may alternatively be referred to as non-binary, multi-bit, or higher-order modulation schemes and symbols.

The memory device 110 may be configured to bypass internal error correction operations during an execution of an access operation. During a read operation, the memory device 110 may output data that has not undergone an internal error detection and correction operation. The memory device 110 may perform an internal error detection and correction operation on the data while the access operation is executed. In the event that an error is detected or corrected, the memory device 110 may retroactively output an indication of the detected error and, in some cases, the corrected data. During a write operation, the memory device 110 may store the data and corresponding error correction and detection information (e.g., link ECC bits) generated by an external memory controller 105. Here, the latency introduced by performing an error detection and correction operation at the memory device 110 may be bypassed while still maintaining the reliability associated with storing error detection or correction information.

Figure 2:
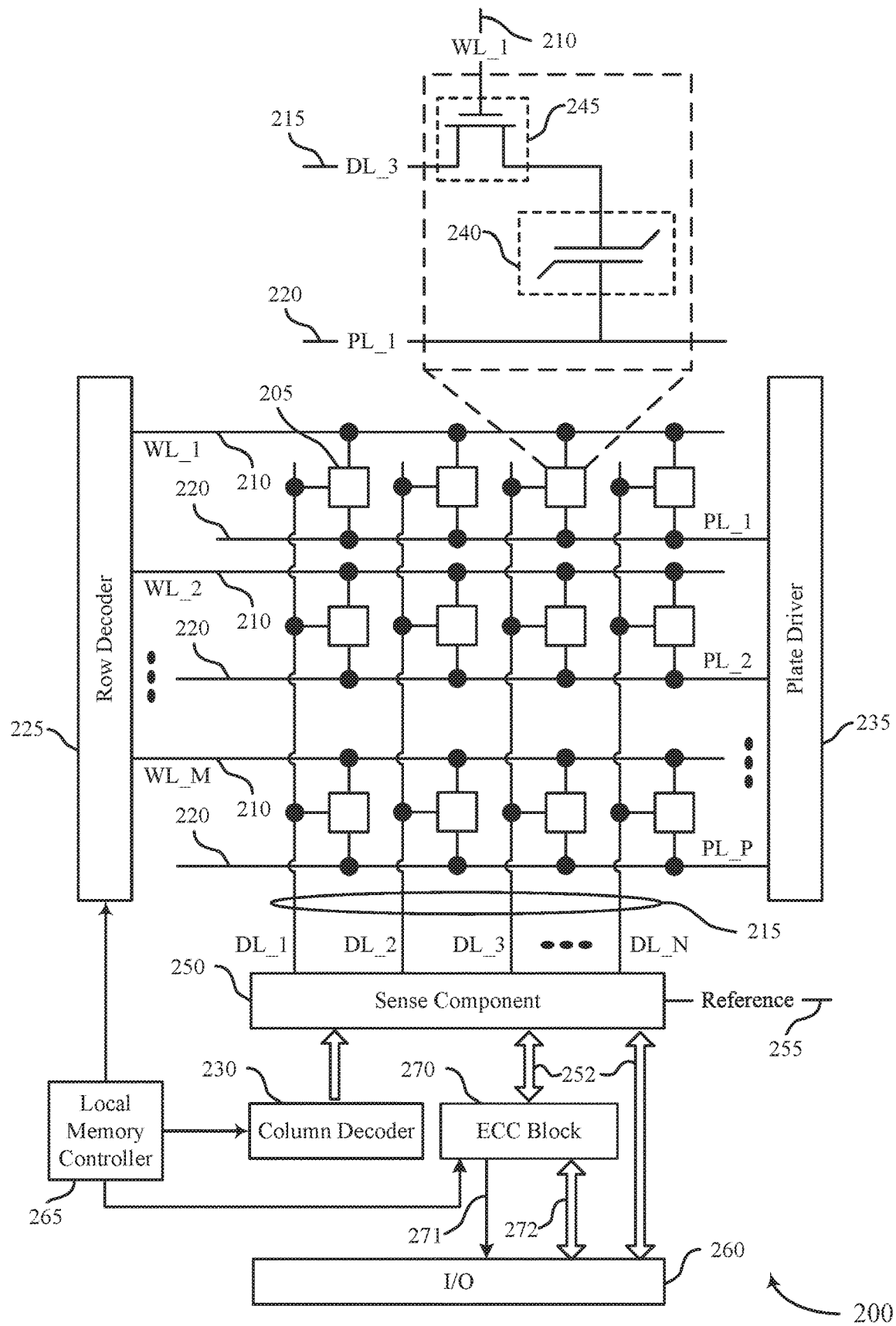
FIG. 2 illustrates an example of a memory die that supports an error correction memory device with fast data access in accordance with examples as disclosed herein.

FIG. 2 illustrates an example of a memory die 200 in accordance with examples as disclosed herein. The memory die 200 may be an example of the memory dice 160 described with reference to FIG. 1. In some cases, the memory die 200 may be referred to as a memory chip, a memory device, or art electronic memory apparatus. The memory die 200 may include one or more memory cells 205 that are programmable to store different logic states. Each memory cell 205 may be programmable to store two or more states. For example, the memory cell 205 may be configured to store one bit of digital logic at a time (e.g., a logic 0 and a logic 1). In some cases, a single memory cell 205 (e.g., a multi-level memory cell) may be configured to store more than one bit of digit logic at a time (e.g., a logic 00, logic 01, logic 10, or a logic 11).

A memory cell 205 may store a state (e.g., polarization state or dielectric charge) that represents digital data. In FeRAM architectures, the memory cell 205 may include a capacitor that includes a ferroelectric material to store a charge and/or a polarization representative of the programmable state. In DRAM architectures, the memory cell 205 may include a capacitor that includes a dielectric material to store a charge representative of the programmable state. In other memory architectures, other storage device and components are possible. For example, nonlinear dielectric materials may be employed.

Operations such as reading and writing may be performed on memory cells 205 by activating or selecting access lines such as a word line 210, a digit line 215, and/or a plate line 220. In some cases, digit lines 215 may also be referred to as bit lines. References to access lines, word lines, digit lines, plate lines or their analogues, are interchangeable without loss of understanding or operation. Activating or selecting a word line 210, a digit line 215, or a plate line 220 may include applying a voltage to the respective line.

The memory die 200 may include the access lines (e.g., the word lines 210, the digit lines 215, and the plate lines 220) arranged in a grid-like pattern. Memory cells 205 may be positioned at intersections of the word lines 210, the digit lines 215, and/or the plate lines 220. By biasing a word line 210, a digit line 215, and a plate line 220 (e.g., applying a voltage to the word line 210, digit line 215, or plate line 220), a single memory cell 205 may be accessed at their intersection.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address. For example, the memory die 200 may include multiple word lines 210, labeled WL_1 through WL_M, multiple digit lines 215, labeled DL_1 through DL_N, and multiple plate lines, labeled PL_1 through PL_P, where M, N, and P depend on the size of the memory array. Thus, by activating a word line 210, a digit line 215, and a plate line 220, e.g., WL_1, DL_3, and PL_1, the memory cell 205 at their intersection may be accessed. The intersection of a word line 210 and a digit line 215, in either a two-dimensional or three-dimensional configuration, may be referred to as an address of a memory cell 205. In some cases, the intersection of a word line 210, a digit line 215, and a plate line 220 may be referred to as an address of the memory cell 205.

The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two (2) components.

Selecting or deselecting the memory cell 205 may be accomplished by activating or deactivating the switching component 245. The capacitor 240 may be in electronic communication with the digit line 215 using the switching component 245. For example, the capacitor 240 may be isolated front digit line 215 when the switching component 245 is deactivated, and the capacitor 240 may be coupled with digit line 215 when the switching component 245 is activated. In some cases, the switching component 245 is a transistor and its operation is controlled by applying a voltage to a transistor gate, where the voltage differential between the transistor gate and transistor source is greater or less than a threshold voltage of the transistor. In some cases, the switching component 245 may be a p-type transistor or an n-type transistor. The word line 210 may be in electronic communication with the gate of the switching component 245 and may activate/deactivate the switching component 245 based on a voltage being applied to word line 210.

A word line 210 may be a conductive line in electronic communication with a memory cell 205 that is used to perform access operations on the memory cell 205. In some architectures, the word line 210 may be in electronic communication with a gate of a switching component 245 of a memory cell 205 and may be configured to control the switching component 245 of the memory cell. In some architectures, the word line 210 may be in electronic communication with a node of the capacitor of the memory cell 205 and the memory cell 205 may not include a switching component.

A digit line 215 may be a conductive line that connects the memory cell 205 with a sense component 250. In some architectures, the memory cell 205 may be selectively coupled with the digit line 215 during portions of an access operation. For example, the word line 210 and the switching component 245 of the memory cell 205 may be configured to selected couple and/or isolate the capacitor 240 of the memory cell 205 and the digit line 215. In some architectures, the memory cell 205 may be in electronic communication (e.g., constant) with the digit line 215.

A plate line 220 may be a conductive line in electronic communication with a memory cell 205 that is used to perform access operations on the memory cell 205. The plate line 220 may be in electronic communication with a node (e.g., the cell bottom) of the capacitor 240. The plate line 220 may be configured to cooperate with the digit line 215 to bias the capacitor 240 during access operation of the memory cell 205.

The sense component 250 may be configured to detect a state (e.g., a polarization state or a charge) stored on the capacitor 240 of the memory cell 205 and determine a logic state of the memory cell 205 based on the detected state. The charge stored by a memory cell 205 may be extremely small, in some cases. As such, the sense component 250 may include one or more sense amplifiers to amplify the signal output of the memory cell 205. The sense amplifiers may detect minute changes in the charge of a digit line 215 during a read operation and may produce signals corresponding to either a logic 0 or a logic 1 based on the detected charge. During a read operation, the capacitor 240 of memory cell 205 may output a signal (e.g., discharge a charge) to its corresponding digit line 215. The signal may cause a voltage of the digit line 215 to change. The sense component 250 may be configured to compare the signal received from the memory cell 205 across the digit line 215 to a reference signal 255 (e.g., a reference voltage). The sense component 250 may determine the stored state of the memory cell 205 based on the comparison. For example, in binary-signaling, if digit line 215 has a higher voltage than the reference signal 255, the sense component 250 may determine that the stored state of memory cell 205 is a logic 1, and, if the digit line 215 has a lower voltage than the reference signal 255, the sense component 250 may determine that the stored state of the memory cell 205 is a logic 0. The sense component 250 may include various transistors or amplifiers to detect and amplify a difference in the signals. The detected logic state of memory cell 205 may be output through ECC block 270 by I/O 260. Here, the ECC block 270 may perform an error detection and correction operation on the detected logic state of memory cell 205 and output data (e.g., the original data or corrected data) by I/O 260. In some other cases, the detected logic state of memory cell 205 may bypass ECC block 270 and be output by I/O 260. In some cases, the detected logic state of memory cell 205 may be output through the ECC block 270 and around ECC block 270 by I/O 260. Here, the detected logic state of memory cell 205 may be output from the memory die 200 at a same time as ECC block 270 performs an error detection and correction operation on the detected logic state of memory cell 205. In some cases, the sense component 250 may be part of another component (e.g., a column decoder 230, row decoder 225). In some cases, the sense component 250 may be in electronic communication with the row decoder 225, the column decoder 230, and/or the plate driver 235.

The local memory controller 265 may control the operation of memory cells 205 through the various components (e.g., row decoder 225, column decoder 230, plate driver 235, sense component 250, ECC block 270). The local memory controller 265 may be an example of the local memory controller 165 described with reference to FIG. 1. In some cases, one or more of the row decoder 225, column decoder 230, plate driver 235, sense component 250, and ECC block 270 may be co-located with the local memory controller 265. The local memory controller 265 may be configured to receive one or more commands and/or data from an external memory controller 105 (or a device memory controller 155 described with reference to FIG. 1), translate the commands and/or data into information that can be used by the memory die 200, perform one or more operations on the memory die 200, and communicate data from the memory die 200 to the external memory controller 105 (or the device memory controller 155) in response to performing, the one or more operations. The local memory controller 265 may generate row, column, and/or plate line address signals to activate the target word line 210, the target digit line 215, and the target plate line 220. The local memory controller 265 may also generate and control various voltages or currents used during the operation of the memory die 200. In general, the amplitude, shape, or duration of an applied voltage or current discussed herein may be adjusted or varied and may be different for the various operations discussed in operating the memory die 200.

In some cases, the local memory controller 265 may be configured to perform a precharge operation on the memory die 200. A precharge operation may comprise precharging one or more components and/or access lines of the memory die 200 to one or more predetermined voltage levels. In some instances, the memory cell 205 and/or portions of the memory die 200 may be precharged between different access operations. In some instances, the digit line 215 and/or other components may be precharged before a read operation.

In some cases, the local memory controller 265 may be configured to perform a write operation (e.g., a programming operation) on one or more memory cells 205 of the memory die 200. During a write operation, a memory cell 205 of the memory die 200 may be programmed to store a desired logic state. In some cases, a plurality of memory cells 205 may be programmed during a single write operation. The local memory controller 265 may identify a target memory cell 205 on which to perform the write operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or the target plate line 220 (e.g., applying a voltage to the word line 210, digit line 215, or the plate line 220), to access the target memory cell 205. The local memory controller 265 may apply a specific signal (e.g., voltage) to the digit line 215 and a specific signal (e.g., voltage) to the plate line 220 during the write operation to store a specific state in the capacitor 240 of the memory cell 205, the specific state being indicative of a desired logic state.

The ECC block 270 or the local memory controller 265 may perform one or more error detection and correction operations on data received from the host device as part of a write operation. For example, the ECC block 270 may receive data from the host device as part of a write operation. The ECC block 270 may determine or generate error detection or correction information associated with the data. In some cases, the ECC block 270 may include error detection logic or may cause error detection logic (not shown) to perform the error detection operations described herein. The ECC block 270 may cause the data and the error detection or correction information to be stored in one or more memory cells 205 as part of the write operation. In another example, the ECC block 270 may receive data and associated error detection or correction information from a memory array as part of a read operation. The ECC block 270 may perform an error detection and correction operation based on the data and the error detection or correction information.

The error detection and correction operations at the memory device may add latency to access operations (e.g., a read operation, a write operation). For example, the error detection and correction operation may take several nanoseconds, and the data (e.g., corrected data) may not be available until the error detection and correction operation is complete. It may be desirable to decrease the latency associated with access operations. In one example, the memory device may suppress operation of the ECC block 270 and execute the access operation without using or generating corresponding error detection or correction information. But suppressing operation of the ECC block 270 decrease the reliability of the memory system.

Memory die 200 may concurrently perform an internal error detection and correction operation while outputting data that bypasses the internal error detection and correction operation. In some cases, memory die 200 may bypass the ECC block 270 during an execution of an access operation. During a read operation, data 252 from the sense component 250 may bypass the ECC block 270 for output via I/O 260 and also be sent to the ECC block 270. The ECC block 270 may perform an internal error detection and correction operation on the data 252 while the data 252 is output via I/O 260. In the event that the ECC block 270 detects and/or corrects an error, the ECC block 270 may output an indication 271 of the detected error (e.g., via I/O 260). In some cases, ECC block 270 may (e.g., retroactively) output the corrected data 272 (e.g., via I/O 260). Alternatively, the ECC block 270 may store the indication 271 of the corrected error and output the indication to a host device via a sideband or control channel (e.g., the host device may read a register storing the indication 271 of the corrected error). Additionally or alternatively, memory die 200 may support flow through ECC for write operations. During a write operation, the memory device may store the data and corresponding error correction and detection information generated by a host device (e.g., link ECC information). Here, the latency introduced by performing an error detection and correction operation at the ECC block 270 may be bypassed while still maintaining the reliability associated with storing error detection or correction information.

In some cases, the local memory controller 265 may be configured to perform read operation (e.g., a sense operation) on one or more memory cells 205 of the memory die 200. During a read operation, the logic state stored in a memory cell 205 of the memory die 200 may be determined. In some cases, a plurality of memory cells 205 may be sensed during a single read operation. The local memory controller 265 may identify a target memory cell 205 on which to perform the read operation. The local memory controller 265 may identify a target word line 210, a target digit line 215, and/or a target plate line 220 in electronic communication with the target memory cell 205 (e.g., the address of the target memory cell 205). The local memory controller 265 may activate the target word line 210, the target digit line 215, and/or a target plate line 220 (e.g., applying a voltage to the word line 210, the digit line 215, or the plate line 220), to access the target memory cell 205. The target memory cell 205 may transfer a signal to the sense component 250 in response to biasing the access lines. The sense component 250 may amplify the signal. The local memory controller 265 may fire the sense component 250 (e.g., latch the sense component) and thereby compare the signal received from the memory cell 205 to the reference signal 255. Based on that comparison, the sense component 250 may determine a logic state that is stored on the memory cell 205. The local memory controller 265 may communicate the logic state stored on the memory cell 205 to the external memory controller 105 (or the device memory controller) as part of the read operation.

In some memory architectures, accessing the memory cell 205 may degrade or destroy the logic state stored in a memory cell 205. For example, a read operation performed on a ferroelectric memory cell may destroy the logic state stored in the ferroelectric capacitor. In another example, a read operation performed in DRAM architectures may partially or completely discharge the capacitor of the target memory cell. The local memory controller 265 may perform a re-write operation or a refresh operation to return the memory cell to its original logic state. The local memory controller 265 may re-write the logic state to the target memory cell after a read operation. In some cases, the re-write operation may be considered part of the read operation. Additionally, activating a single access line, such as a word line 210, may disturb the state stored in some memory cells in electronic communication with that access line. Thus, a re-write operation or refresh operation may be performed on one or more memory cells that may not have been accessed.

Figure 3:
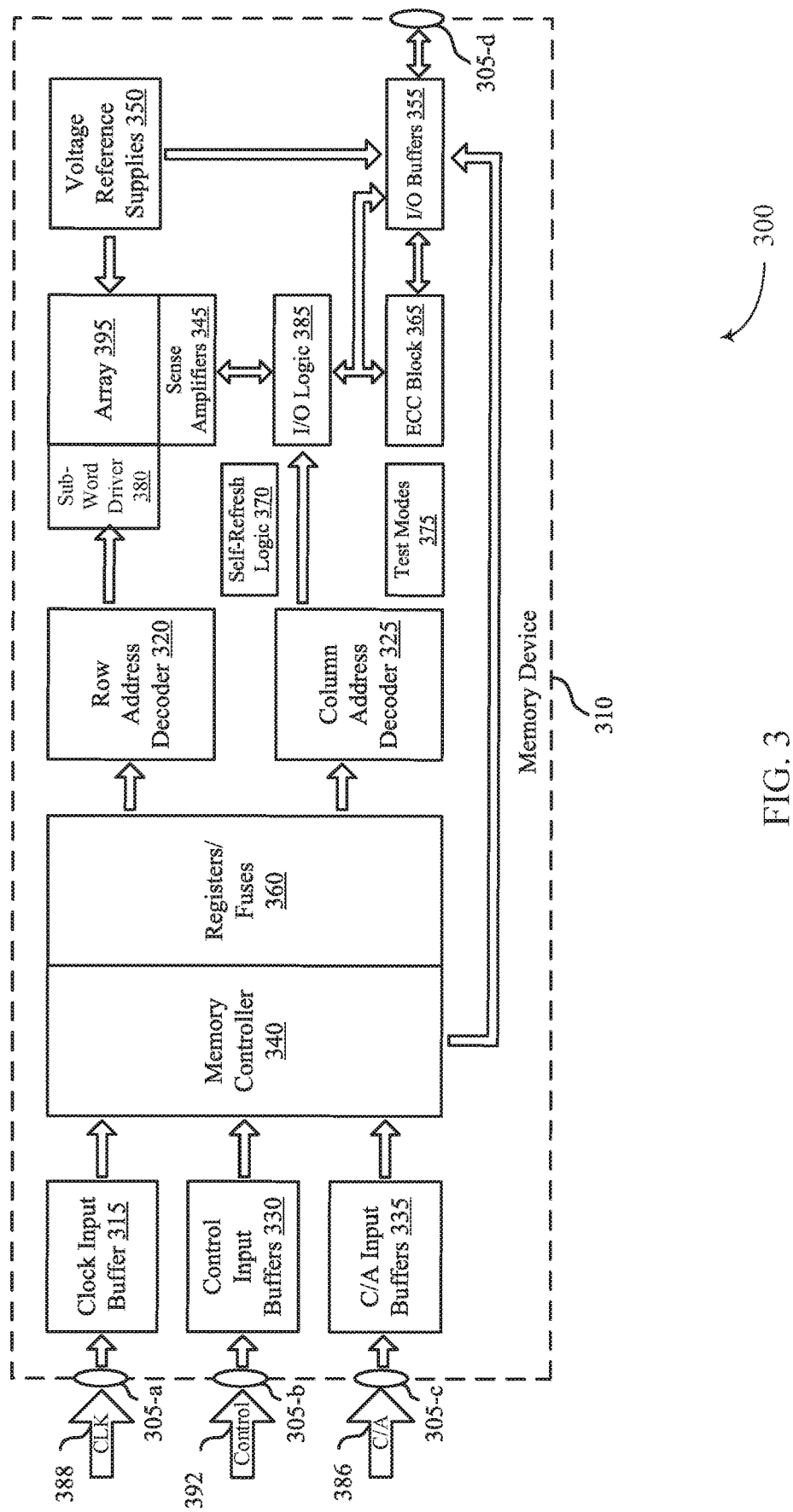
FIGS. 3, 4A, 4B and 5 illustrate examples of systems that support an error correction memory device with fast data access as disclosed herein.

FIG. 3 illustrates an example of a system 300 that supports an error correction memory device with fast data access as disclosed herein. The system 300 may include one or more components as described with reference to FIGS. 1 and 2. The system 300 may include a memory device 310 coupled to a plurality of channels (e.g., C/A channel 386, CLK channel 388, control channel 392, or a combination thereof) that may be in communication with an external memory controller (e.g., as described with reference to FIG. 1). The memory device 310 may be an example of memory device 110 and/or the memory die 200 described with reference to FIGS. 1 and 2; the C/A channel 386, the CLK channel 388, and the control channel 392 may be examples of C/A channel 186, the CLK channel 188, and the other channel 192 respectively as described with reference to FIG. 1; the array 395 may be an example of one or more of the memory arrays 170 as described with reference to FIG. 1; the memory controller 340 and the registers/fuses 360 may include aspects of the device memory controller 155 or local memory controllers 165 or 265 as described with reference to FIGS. 1 and 2; the row address decoder 320 may be an example of the row decoder 225 described with reference to FIG. 2; the column address decoder 325 may be an example of the column decoder 230 described with reference to FIG. 2; the voltage reference supplies 350 may be an example of the reference line 250 as described with reference to FIG. 2; the sense amplifiers 345 and the I/O Logic 385 may include aspects of the sense component 245 as described with reference to FIG. 2; the ECC block 365 may be an example of the ECC block 270 as described with reference to FIG. 2; and the I/O buffers 355 may be an example of the I/O 260 as described with reference to FIG. 2. The memory device 310 may also include clock input buffer 315, control input buffer 330, C/A input buffers 335, sub-word driver 380, buffer logic 390, and self-refresh logic 370.

The memory device 310 may be coupled with a plurality of channels for communication with an external memory controller (e.g., a host device). Signals communicated over the channels may be received by an interface 305 and stored at a buffer associated with the channel. The channels may be dedicated to communicating specific types of information. For example, the CLK channel 388 may be configured to communicate one or more common clock signals between an external memory controller and the memory device 310. The memory device 310 may receive CLK signals by the interface 305-a and perform clock stabilization and recovery at the clock input buffer 315. In another example, the control channel 392 may be configured to communicate control signals with an external memory controller. The control signals may be communicated by the interface 305-b and captured at the control input buffers 330. In a third example, the C/A channels may be configured to communicate commands between the external memory controller and the memory device 310 including address information associated with the commands. The C/A signals may be received by the interface 305-c and captured at the C/A input buffers 335.

The memory controller 340 may receive information stored in the input buffers. For example, the memory controller 340 may receive and store control signals and/or C/A signals from the control input buffers 330 and C/A input buffers 335 respectively. Memory device 310 may also include registers/fuses 360. Based on information stored in the memory controller 340 or the registers/fuses 360, the memory controller 340 may control the operation of the memory device 310 through the various components (e.g., row address decoder 320, column address decoder 325, sub-word driver 380). The memory controller 340 may be configured to receive commands and/or data from the control input buffers 330 and C/A input buffers 335, translate the commands and/or data into information that can be used by the memory device 310, perform one or more operations on the memory device 310, and communicate data from the memory device to an external memory controller by the I/O Buffers 355 and interface 305-d in response to performing the one or more operations.

The memory controller 340 may generate row and column address signals based on commands and/or data received by the memory device 310. The memory controller 340 may communicate the row address signals to the row address decoder 320 and the column address signals to the column address decoder 325. The row address decoder 320 may activate a word line at the array 395 (or a portion of a word line by the sub-word driver 380). The column address decoder 325 may activate a digit line based on the received column address. Thus, the memory cell(s) at the intersection of the word line and digit line(s) may be accessed. In some cases, the quantity of memory cells associated with the word line that are accessed may be based on the sub-word driver 380. That is, the sub-word driver 380 may access an entire word line or a portion of the word line based on the row address received from the memory controller 340. The memory cells of the array 395 associated with the word line or portion of the word line may be accessed.

The sense amplifiers 345 may be configured to amplify the signal output by the array 395. The sense amplifiers 345 may output the amplified signal to the I/O logic 385. During a read operation, the sense amplifiers 345 may be configured to detect a state (e.g., a charge) stored at the array 395. For example, the sense amplifiers 345 may compare a signal received from the array 395 to a voltage from the voltage reference supplies 350. The sense amplifiers 345 may determine the stored state of one or more memory cells based on the comparison. The sense amplifiers 345 may output the detected logic state to the I/O logic 385. During a write operation, the I/O Logic 385 may receive data from the I/O buffers 355 via the ECC block 365. The data may be stored at the array 395 based on the digit and word lines activate by the column address decoder 325 and the row address decoder 320.

The ECC block 365 may perform one or more error detection or correction operations on data received from an external memory controller or from the I/O logic 385 (e.g., previously stored at the array 395). During a write operation, the ECC block 365 may generate error detection or correction information based on the data received front the external memory controller (e.g., from the I/O buffers 355). For example, parity or Hamming code information may be generated based on the data. The ECC block 365 may communicate the generated error detection or correction information to the I/O logic 385 to be stored at the array 395 with the data. During a read operation, the ECC block 365 may perform in-line ECC. Here, the ECC block 365 may receive data and the error detection or correction information (e.g., associated with the data and stored at the array 395) from the I/O logic 385. The ECC block 365 may also generate error detection or correction information based on the data read from the array 395 during the read operation. Further, the ECC block 365 may compare the received error detection or correction information with the generated error detection or correction information. In the event that the received error detection or correction information and the generated error detection or correction information do not match, the ECC block 365 may detect an error.

The error detection operations performed by ECC block 365 may add delay into the command execution. For example, an error detection operation may take between several nanoseconds, or may add one or more clock cycles of latency to when the data is ready for output via the I/O buffers 355. In some cases, additional delay may be associated with certain error detection operations (e.g., H-matrix syndrome generation, error decoding). In a case where an error detection operation occurs during each access command (e.g., for each read command, for each write command), there may be a corresponding latency to the operation of the memory device 310. For example, if the error detection operation introduces two (2) nanoseconds of latency into a read operation, one thousand (1000) read operations would correspond to two thousand (2000) nanoseconds of latency. If the ECC block 365 detects one error (e.g., one single-bit error) in the one thousand (1000) read operations, the other 999 read operations will have performed unnecessary error detection operations and accrued 1,998 nanoseconds of latency.

In some instances, an alternate path between the I/O logic 385 and the I/O buffers 355 may be utilized to bypass the ECC block 365 (thus eliminating the delay resulting from the error detection operations performed at the ECC block 365). Here, data may be transferred between the I/O logic 385 and the I/O buffers 355 at a same time as the ECC block 365 performs an error detection operation on the data. If an error is detected by the ECC block 365 during the execution of the command, an indication of the detected error (and, in some cases, corrected data) may be retroactively communicated to the external memory controller. For example, during a read operation, data may be transferred from the I/O logic 385 to the I/O buffers 355 (and subsequently to an external memory controller by the interface 305-$d$) while the ECC block 365 performs an error detection operation on the data. If the ECC block 365 detects an error, the ECC block 365 may indicate the error to the external memory controller during or after the original data (e.g., with the detected error) has been communicated to the external memory controller. Here, if the error detection operation introduces two (2) nanoseconds of latency into a read operation, and the ECC block 365 detects one error (e.g., a single-bit error) in one thousand read operations, the latency associated with the one thousand read operations may be equal to one burst length for re-reading the corrected data from the read operation with the error.

The memory device 310 may include self-refresh logic 370. The self-refresh logic 370 may enable the memory device 310 to initiate refresh operations. The self-refresh mode may be used in a low-power or standby state of the memory device 310, where the memory device 310 may not receive memory commands including refresh commands. In self-refresh mode, the registers/fuses 360 or the self-refresh logic 370 may refresh array 395 using an internal oscillator, internal counters, or the like. The registers/fuses 360 or the self-refresh logic 370 may determine a refresh rate.

The memory device may include test modes 375. The test modes 375 may provide an interface for testing and diagnostic functions of the memory device 310.

Figure 4A:
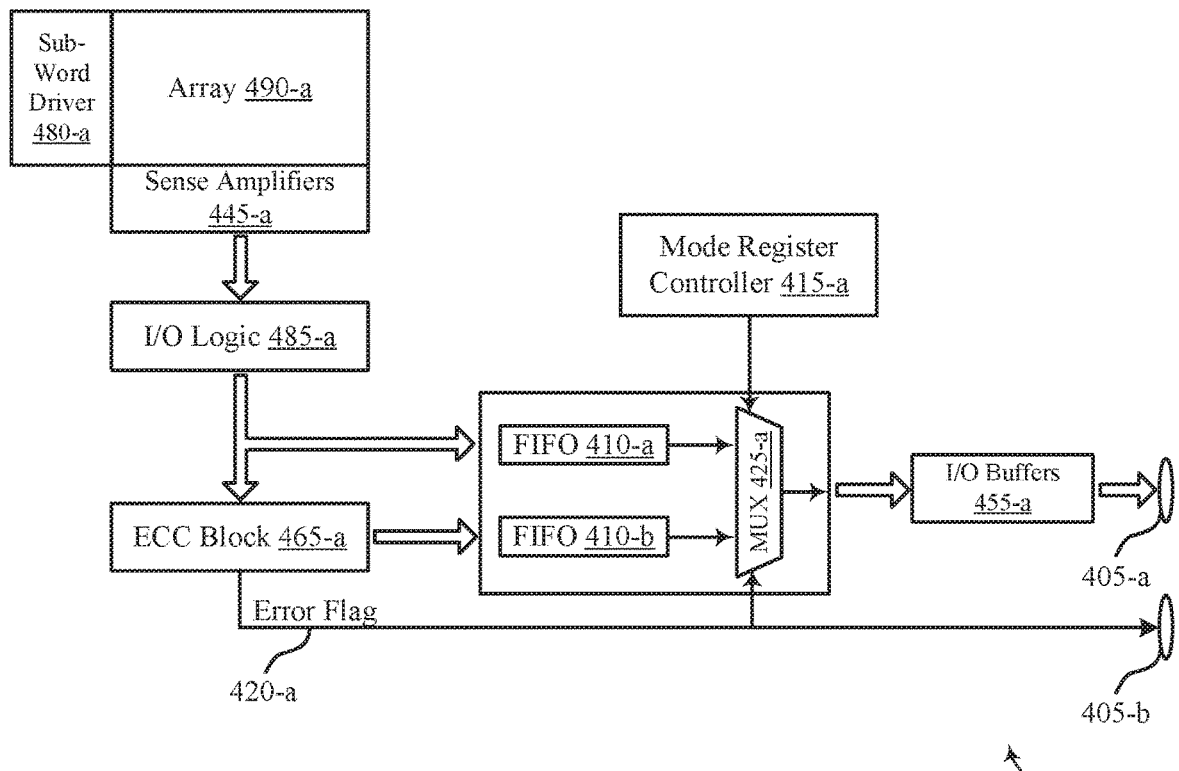

FIG. 4A illustrates an example of a system 400-$a$ that supports an error correction memory device with fast data access as disclosed herein. The system 400-$a$ may include one or more components as described with reference to FIGS. 1, 2, and 3. For example, the system 400-$a$ may include an array 490-$a$ which may be an example of one or more of the memory arrays 170 or the array 395 as described with reference to FIGS. 2 and 3; the sense amplifiers 445-$a$ which may include aspects of the sense component 250 and the sense amplifiers 345 as described with reference to FIGS. 2 and 3; the I/O logic 485-$a$ which may include aspects of the I/O logic 385 as described with reference to FIG. 3; the ECC block 465-$a$ which may be an example of the ECC block 270 or ECC block 365 as described with reference to FIGS. 2 and 3; the I/O buffers 455-$a$ may be an example of the input/output 260 or the I/O buffers 355 as described with reference to FIGS. 2 and 3; and the interfaces 405 which may include aspects of the interfaces 305 as described with reference to FIG. 3. The system 400-$a$ may also include first-in first-out (FIFO) buffers 410 and multiplexer (MUX) 425-$a$.

The system 400-$a$ may be configured to perform a read operation. The system 400-$a$ may receive a read command (e.g., from a host device). The read command may indicate data to be read from the array 490-$a$ (e.g., via an address of the read command). In some cases, (e.g., if the system 400-*a* is associated with an ECC memory device), the array 490-*a* may store error detection or correction information for error detection and correction of the data. The system 400-*a* may be in communication with a memory controller (e.g., as described with reference to FIGS. 1 and 2) which may indicate to the sub-word driver 480-*a* a word line or portion of a word line to activate or select based on the received read command. Thus, the memory controller may indicate a portion of the array 490-*a* to be read. During the read operation, the sense amplifiers 445-*a* may detect and amplify the signals output by the array 495-*a*. After amplifying the signals, the sense amplifiers 445-*a* may output the signals to the I/O logic 485-*a*. The signals may correspond to the data indicated by the read command and error detection or correction information associated with the data indicated by the read command (e.g., first error detection or correction information).

The data output to the I/O logic 485-*a* may be communicated to the FIFO buffer 410-*a* and the ECC block 465-*a*. The data output from the I/O logic 485-*a* to the FIFO buffer 410-*a* may correspond to first data. The first data may bypass the on-die ECC block 465-*a*. Therefore, the first data may correspond to data where no correction occurs (e.g., raw data from array 490-*a*).

The I/O logic 485-*a* may communicate the data and the error detection or correction information associated with the data to the ECC block 465-*a*. The ECC block 465-*a* may perform an error detection and correction operation on the data based on the associated error detection or correction information. That is, after receiving the read command for the data, the ECC block 465-*a* may generate new error detection or correction information (e.g., second error detection or correction information) based on the data as retrieved from the array 490-*a* by the I/O logic 485-*a* using the same error-correcting code previously used to generate the first error detection or correction information. If the first and second error detection or correction information match, the ECC block 465-*a* may determine that the data is not corrupt (e.g., no errors exist). If the first and second error detection or correction information do not match, the ECC block 465-*a* may determine that the data is corrupt (e.g., at least one error exists).

If the ECC block 465-*a* determines that the data is corrupt, the ECC block 465-*a* may correct the data to produce second data corresponding to a corrected version of the data read from the array 490-*a*. Further, the ECC block 465-*a* may indicate the error to the host device. That is, the ECC block 465-*a* may set the error flag 420-*a* to indicate the error. The host device may receive the error flag by the interface 405-*b*. The interface 405-*b* (e.g., corresponding to the error flag 420-*a*) may correspond to a pin dedicated for error flagging or a multifunction pin (e.g., a pin for direct memory interface, a pin for decoding status feedback).

If the ECC block 465-*a* is an SEC ECC block 465-*a*, then the ECC block 465-*a* may detect and correct single-bit errors. Here, the second data may include a corrected single-bit error. Further, the error flag 420-*a* may indicate one or more of a corrected single-bit error, an uncorrected error, or an erroneously flipped bit within the second data (e.g., an aliased bad bit). Additionally or alternatively, if the ECC block 465-*a* is an SECDED ECC block 465-*a*, then the ECC block 465-*a* may detect and correct single-bit errors and detect double-bit errors. Here, the second data may include a corrected single-bit error. Further, the error flag 420-*a* may indicate one or more of a corrected single-bit error, a detected double-bit error, an uncorrected error, or an erroneously flipped bit in the second data (e.g., an aliased bad bit). In some other cases, the ECC block 465-*a* may implement a different ECC scheme (e.g., other than SEC or SECDED ECC). Here, the second data may be based on the type of errors that are detectable or correctable by the different ECC scheme.

The ECC block 465-*a* may output the second data to the FIFO buffer 410-*b*. In some cases, the ECC block 465-*a* may not output data to the FIFO buffer 410-*b* when no errors are detected or corrected. In some other cases, the ECC block 465-*a* may output second data to the FIFO buffer 410-*b* during an execution of every read operation. That is, when executing a read operation, the ECC block 465-*a* replaces any existing data within the FIFO buffer 410-*b* with data corresponding to the second data determined during the execution of the current read command. Depending on an input from the mode register controller 415-*a* (e.g., from the mode register controller 415-*a* to the MUX 425-*a*), either the first data stored at the FIFO buffer 410-*a* or the second data stored at FIFO buffer 410-*b* may be propagated from the FIFO buffers 410 to the I/O buffers 455-*a*. That is, the mode register controller 415-*a* may adapt the MUX 425-*a* to select either the FIFO buffer 410-*a* or the FIFO buffer 410-*b*. Data communicated to the I/O buffers 455-*a* may be propagated from the FIFO buffers 410 through the MUX 425-*a* according to a first-in first-out order. Data within the I/O buffers 455-*a* may be communicated, by the interface 405-*a*, to a host device. Thus, the system 400-*a* may communicate data stored at the array 490-*a* to the host device based on the read command received from the host device.

In a first mode, the mode register controller 415-*a* may indicate for data from the FIFO buffer 410-*a* to be propagated through the MUX 425-*a* to the I/O buffers 455-*a*. In some cases, this may be a flow-through mode. That is, the first data associated with the read operation may bypass the ECC block 465-*a* by flowing directly from the I/O logic 485-*a* to the I/O buffers 455-*a*. By bypassing the ECC block 465-*a*, the first mode may bypass a latency associated with the ECC block 465-*a*. For example, the error detection and correction operation may take between several nanoseconds. Thus, by bypassing this error detection and correction operation, the first mode may have a lower latency. In this mode, the ECC block 465-*a* may perform error detection and correction operations on the first data in parallel to the first data being communicated from the I/O logic 485-*a* to the I/O buffers 455-*a*.

In a second mode, the mode register controller 415-*a* may indicate for data from the FIFO buffer 410-*b* to be propagated through the MUX 425-*a* to the I/O buffers 455-*a*. In some cases, this may be an ECC syndrome mode. When operating in the second mode, the data associated with read commands is propagated through the ECC block 465-*a* to the I/O buffers 455-*a*. That is, the system 400-*a* transmits data that has undergone an error detection and correction operation. In some cases, the mode register controller 415-*a* may be set to operate according to this second mode. That is, certain systems 400-*a* may not be enabled to utilize the first mode that bypasses the ECC block 465-*a*. For example, the system 400-*a* may use a specific mode setting or register code in order to utilize the first mode for bypassing the ECC block 465-*a*.

In some cases, the mode register controller 415-*a* may be based on whether the ECC block 465-*a* detects and/or corrects an error in the first data to produce second data. For example, the mode register controller 415-*a* may indicate for the system 400-*a* to propagate the first data from the FIFO buffer 410-*a* to the I/O buffers 455-*a*. However, if the ECC block 465-*a* detects and/or corrects an error in the first data to produce the second data, the mode register controller 415-*a* may indicate for the system 400-*a* to propagate the second data from the FIFO buffer 410-*b* to the I/O buffers 455-*a*. In some cases, because the path from the FIFO buffer 410-*a* to the I/O buffers 455-*a* is faster (e.g., has less latency due to bypassing the ECC block 465-*a*), the mode register controller 415-*a* may retroactively indicate to propagate the second data from the FIFO buffer 410-*b* to the I/O buffers 455-*a*. That is, the system 400-*a* may communicate both all or a portion of the first data (e.g., by the FIFO buffer 410-*a*) and the second data (e.g., by the FIFO buffer 410-*b*) to the host device. In this way, the latency resulting from the error detection and correction operation may be minimized by bypassing the ECC block 465-*a* when no errors are detected. In some other cases, the memory system 400-*a* may allow all data associated with read commands to bypass the ECC block 465-*a*.

In a first example, the mode register controller 415-*a* may automatically adjust the output of MUX 425-*a* based on whether the ECC block 465-*a* detects and/or corrects an error in the first data to produce second data. This may be referred to as a flow-through ECC automatic mode. Here, if the ECC block 465-*a* detects and/or corrects the data to generate the second data, the system 400-*a* may flag the detected and/or corrected error by the error flag 420-*a*. The error flag 420-*a* may further include an indication that the system 400-*a* will communicate the second data after communicating the first data. For example, the system 400-*a* may communicate all or a portion of the first data to the host device by the I/O buffers 455-*a* by a first burst. The indication may indicate that the second data will immediately follow the first burst (e.g., a double burst of all or a portion of the first data followed by the second data). The mode register controller 415-*a* may indicate for the system 400-*a* to propagate the second data from the FIFO buffer 410-*b* to the I/O buffers 455-*a* in the next burst. For example, the system 400-*a* may be operating according to the first mode (e.g., bypassing the ECC block 465-*a*). The ECC block 465-*a* may detect a single-bit error (e.g., by an SEC operation) and indicate by the error flag 420-*a* that the second data will interrupt or immediately follow the burst containing the first data.

Additionally or alternatively, the indication may indicate a delay of the second data. The mode register controller 415-*a* may indicate for the system 400-*a* to propagate the second data from the FIFO buffer 410-*b* to the I/O buffers 455-*a* in a burst after the first burst in accordance with the indicated delay. The delay may correspond to a quantity of bursts. For example, the delay may indicate two (2) bursts such that the second data may be propagated from the FIFO buffer 410-*b* to the I/O buffers 455-*a* in a burst that is two (2) bursts after the completion of the first burst. In some cases, the delay for the flow-through ECC automatic mode may be approximately 2.5 nanoseconds. In these cases, the ECC block 465-*a* may generate the indication within 1.5 to two (2) nanoseconds. For example, the system 400-*a* may use additional cycles (e.g, READ clocks corresponding to a burst length) to communicate the second data from the FIFO buffer 410-*b* to the host device after communicating the first data from the FIFO buffer 410-*a*. The delay may support memory systems with low latency constraints.

In a second example, the mode register controller 415-*a* may adjust the output of MUX 425-*b* based on an indication received from the host device. This may be referred to as ECC dedicated mode. Here, the host device may receive an indication of a detected and/or corrected error (e.g., by the error flag 420-*a*). When the host device receives the indication of the detected and/or corrected error, the host device may suspend operation of the system 400-*a* and may indicate to the mode register controller 415-*a* to set the MUX 425-*a* to propagate the second data (e.g., generated by correcting at least one error in the first data) from the FIFO buffer 410-*b* to the I/O buffers 455-*a*. The host device may indicate to the mode register controller 415-*a* to propagate the second data from the FIFO buffer 410-*b* within a time limit within 1.5 nanoseconds). Thus, the data may be directed through the ECC block 465-*a*. Setting the mode register controller 415-*a* to direct data through the ECC block 465-*a* may correspond to disabling the flow-through mode. The host device may repeat the read command (or read commands) corresponding to the indication of the detected and/or corrected error. Because the host device set the mode register controller 415-*a* to disable the flow-through mode, when executing the reread (or rereads), the data may be directed through the ECC block 465-*a*. In some cases, the rereads may include the system 400-*a* rewriting the corrected data to the array 490-*a*.

Additionally or alternatively, the host device may receive an indication of a detected and/or corrected error and not initiate a reread. The host device may correct the error within the first data (e.g., as received from the system 400-*a*) at the host device. In some cases, this may avoid errors introduced by an SEC operation at the system 400-*a* (e.g., an erroneously flipped bit by the ECC block 465-*a*). The host device may determine to continue operating in the first mode (e.g., bypassing the ECC block 465-*a*) or switch the mode register controller 415-*a* to cause the system to operate according to the second mode (e.g., through the ECC block 465-*a*).

The host device may determine whether the system 400-*a* continues to propagate data through the ECC block 465-*a* (e.g., in accordance with the second mode) or switches back to bypassing the ECC block 465-*a* (e.g., in accordance with the first mode). In some cases, the host device may determine a mode based on a section of the array 490-*a* being accessed. For example, the host device may map out sections of the array 490-*a* associated with higher rates of errors (e.g., single-bit errors) than other sections. The host device may determine to switch to the second mode when accessing (e.g., reading) these sections of the array 490-*a*.

The method for adjusting the mode register controller 415-*a* (e.g., adjusting the mode register controller 415-*a* autonomously or based on an indication from the host device) may be non-programmable (e.g., hard-wired or stored in read-only memory (ROM)) or one-time-programmable (OTP) (e.g., stored in one or more fuses or anti-fuses or one or more memory OTP memory). In a second example, the method for adjusting the mode register controller 415-*a* may programmable after assembly (e.g., by the host device, by the original equipment manufacturer).

Figure 4B:
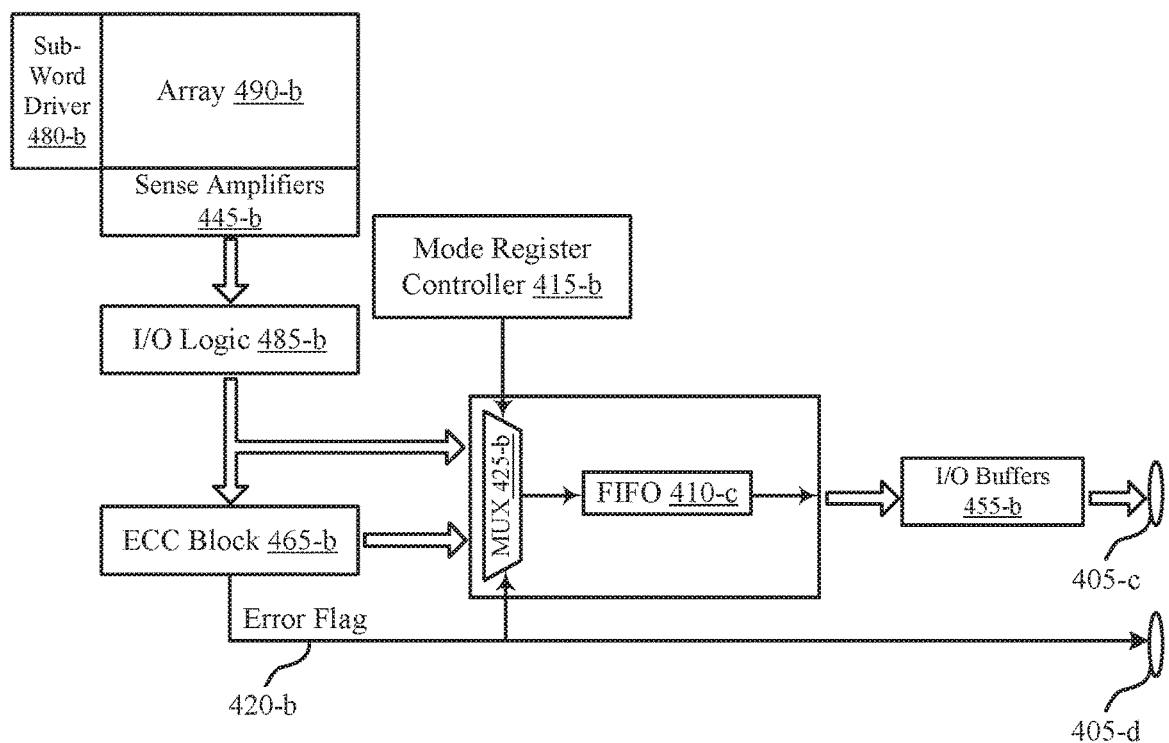

FIG. 4B illustrates an example of a system 400-*b* that supports an error correction memory device with fast data access as disclosed herein. The system 400-*b* may include one or more components as described with reference to FIGS. 1 through 4A. For example, the system 400-*b* may include an array 490-*b* which may be an example of one or more of the memory arrays 170 or arrays 395 and 490-*a* as described with reference to FIGS. 1, 3, and 4A, the sense amplifiers 445-*b* which may include aspects of the sense component 245 and the sense amplifiers 345 and 445-*a* as described with reference to FIGS. 2 through 4A; the I/O logic 485-*b* which may include aspects of the I/O logic 385 and 485-*a* as described with reference to FIGS. 3 and 4A; the ECC block 465-*b* which may be an example of the ECC blocks 270, 365, and 465-*a* as described with reference to FIGS. 2 through 4A; the I/O buffers 455-*b* may be an example of the input/output 260 or the I/O buffers 355 and 455-*a* as described with reference to FIGS. 2 through 4A; and the interfaces 405 which may include aspects of the interfaces 305 and 405 as described with reference to FIGS. 3 and 4A; and the MUX 425-*b* which may be an example of the MUX 425-*a* as described with reference to FIG. 4A. The system 400-*b* may also include FIFO buffer 410-*c*.

The system 400-*b* may be similar to system 400-*a* as described with reference to FIG. 4A. However, system 400-*b* may utilize a different configuration for communicating data from the I/O logic 485-*b* to a host device by the I/O buffers 455-*b*. Specifically, system 400-*b* may utilize a single FIFO buffer 410-*c* rather than two (2) FIFO buffers 410-*a* and 410-*b*. In some cases, this may decrease a physical size of system 400-*b* (e.g., when compared to system 400-*a*). Additionally or alternatively, system 400-*b* may be associated with more latency than system 400-*a*. System 400-*b* may incur delay when outputting corrected data (e.g., from ECC block 465-*b*) after outputting data from I/O logic 485-*b*. System 400-*a* may not incur a similar delay when reading out corrected data from FIFO buffer 410-*b* after reading out data from FIFO buffer 410-*a*.

Similarly to system 400-*a*, system 400-*b* may be configured to perform a read operation. The system 400-*b* may receive a read command (e.g., from a host device). The read command may indicate data to be read from the array 490-*b* (e.g., via an address of the read command). In some cases, (e.g., if the system 400-*b* is associated with an ECC memory device), the array 490-*b* may store error detection or correction information for error detection and correction associated with the data. The system 400-*b* may be in communication with a memory controller (e.g., as described with reference to FIGS. 1 and 2) which may indicate to the sub-word driver 480-*b* a word line or portion of a word line to activate or select based on the received read command. Thus, the memory controller may indicate a portion of the array 490-*b* to be read. During the read operation, the sense amplifiers 445-*b* may detect and amplify the signals output by the array 495-*b*. After amplifying the signals, the sense amplifiers 445-*b* may output the signals to the I/O logic 485-*b*. The signals may correspond to the data indicated by the read command and error detection or correction information associated with the data indicated by the read command (e.g., a first error detection or correction information).

The data output to the I/O logic 485-*b* may be communicated to the MUX 425-*b* directly from the I/O logic 485-*b* or through the ECC block 465-*b*. The data output from the I/O logic 485-*b* may correspond to first data. In some cases, the first data may bypass the on-die ECC block 465-*b*. The I/O logic 485-*b* may communicate the data and the error detection or correction information associated with the data to the ECC block 465-*b*. The ECC block 465-*b* may perform an error detection and correction operation on the data based on the associated error detection or correction information. That is, after receiving the read command for the data, the ECC block 465-*b* may generate new error detection or correction information (e.g., a second error detection or correction information) based on the data as retrieved from the array 490-*b* by the I/O logic 485-*b* using the same error-correcting code previously used to generate the first error detection or correction information. If the first and second error detection or correction information match, the ECC block 465-*b* may determine that the data is not corrupt (e.g., no errors exist). If the first and second error detection or correction information do not match, the ECC block 465-*b* may determine that the data is corrupt (e.g., at least one error exists).

If the ECC block 465-*b* determines that the data is corrupt, the ECC block 465-*b* may correct the data to produce second data corresponding to a corrected version of the data read form the array 490-*b*. Further, the ECC block 465-*b* may indicate the error to the host device. That is, the ECC block 465-*b* may set the error flag 420-*b* to indicate the error. The host device may receive the error flag by the interface 405-*d*. The interface 405-*d* (e.g., corresponding to the error flag 420-*b*) may correspond to a pin dedicated for error flagging or a multifunction pin (e.g., a pin for direct memory interface, a pin for decoding status feedback).

If the ECC block 465-*b* is an SEC ECC block 465-*b*, then the ECC block 465-*b* may detect and correct single-bit errors. Here, the second data may include a corrected single-bit error. Further, the error flag 420-*b* may indicate one or more of a corrected single-bit error, an uncorrected error, or an erroneously flipped bit within the second data (e.g., an aliased bad bit). Additionally or alternatively, if the ECC block 465-*b* is an SECDED ECC block 465-*b*, then the ECC block 465-*b* may detect and correct single-bit errors and detect double-bit errors. Here, the second data may include a corrected single-bit error. Further, the error flag 420-*b* may indicate one or more of a corrected single-bit error, a detected double-bit error, an uncorrected error, or an erroneously flipped bit in the second data (e.g., an aliased bad bit).

The ECC block 465-*b* may output the second data to the MUX 425-*b*. Depending on an input from the mode register controller 415-*b* (e.g., from the mode register controller to the MUX 425-*b*), either the first data from the I/O logic 485-*b* or the second data from the ECC block 465-*b* may be propagated to the FIFO buffer 410-*c*. That is, the mode register controller 415-*b* may indicate to propagate either the first data or the second data. Data communicated to the I/O buffers 455-*b* may be propagated from the FIFO buffer 410-*c* according to a first-in first-out order. Data within the I/O buffers 455-*b* may be communicated, by the interface 405-*c*, to a host device. Thus, the system 400-*b* may communicate data stored at the array 490-*b* to the host device based on the read command received from the host device.

In a first mode, the mode register controller 415-*b* may indicate for the first data from the I/O logic 485-*b* to be propagated through the MUX 425-*b* to the FIFO buffer 410-*c*. In some cases, this may be a flow-through mode. That is, the first data associated with the read operation may bypass the ECC block 465-*b* by flowing directly from the I/O logic 485-*b* and to the I/O buffers 455-*b*. By bypassing the ECC block 465-*b*, the first mode may bypass a latency associated with the ECC block 465-*b*. For example, the error detection and correction operation may take between several nanoseconds. Thus, by bypassing this error detection and correction operation, the first mode may have a lower latency. In this mode, the ECC block 465-*b* may perform error detection and correction operations on the first data in parallel to the first data being communicated front the I/O logic 485-*b* to the I/O buffers 455-*b*.

In a second mode, the mode register controller 415-*b* may indicate for data from the ECC block 465-*b* to be propagated through the MUX 425-*b* to the FIFO buffer 410-*c*. In some cases, this may be an ECC syndrome mode. When operating in the second mode, the data associated with read commands is propagated through the ECC block 465-*b* to the I/O buffers 455-*b*. That is, the system 400-*b* transmits data that has undergone an error detection and correction operation.

In some cases, the mode register controller 415-*b* may be set to operate according to this second mode. That is, certain systems 400-*b* may not be enabled to utilize the first mode that bypasses the ECC block 465-*b*. For example, the system 400-*b* may use a specific mode setting or register code in order to utilize the first mode for bypassing the ECC block 465-*b*.

In some cases, the mode register controller 415-*b* may be based on whether the ECC block 465-*b* detects and/or corrects an error in the first data to produce second data. For example, the mode register controller 415-*b* may indicate for the system 400-*b* to propagate the first data from the I/O logic 485-*b* to the FIFO buffer 410-*c*. However, if the ECC block 465-*b* detects and/or corrects an error in the first data to produce the second data, the mode register controller 415-*b* may indicate for the system 400-*b* to propagate the second data from the ECC block 465-*b* to the FIFO buffer 410-*c*. In some cases, because the path from the I/O logic 485-*b* to the FIFO buffer 410-*c* is faster (e.g., has less latency due to bypassing the ECC block 465-*b*), the mode register controller 415-*b* may retroactively indicate to propagate the second data from the ECC block 465-*b* to the FIFO buffer 410-*c*. That is, the system 400-*b* may communicate both a portion or all of the first data and the second data to the host device. In this way, the latency resulting from the error detection and correction operation may be minimized by bypassing the ECC block 465-*b* when no errors are detected. In some other cases, the memory system 400-*b* may allow all data associated with read commands to bypass the ECC block 465-*b*.

In a first example, the mode register controller 415-*b* may automatically adjust an input to MUX 425-*b* based on whether the ECC block 465-*b* detects and/or corrects an error in the first data to produce second data. This may be referred to as a flow-through ECC automatic mode. Here, if the ECC block 465-*b* detects and/or corrects the data to generate the second data, the system 400-*b* may flag the detected and/or corrected error by the error flag 420-*b*. The error flag 420-*b* may further include an indication that the system 400-*b* will communicate the second data after communicating the first data. For example, the system 400-*b* may communicate all or a portion of the first data to the host device by the I/O buffers 455-*b* by a first burst. The indication may indicate that the second data will immediately follow the first burst (e.g., a double burst of all or a portion of the first data followed by the second data). The mode register controller 415-*b* may indicate for the system 400-*b* to propagate the second data from the ECC block 465-*b* to the FIFO buffer 410-*c* in the next burst. For example, the system 400-*b* may be operating according to the first mode (e.g., bypassing the ECC block 465-*b*). The ECC block 465-*b* may detect a single-bit error (e.g., by an SEC operation) and indicate by the error flag 420-*b* that the second data will interrupt or immediately follow the burst containing the first data.

Additionally or alternatively, the indication may indicate a delay of the second data. The mode register controller 415-*b* may indicate for the system 400-*b* to propagate the second data from the ECC block 465-*b* to the FIFO buffer 410-*c* in a burst after the first burst in accordance with the indicated delay. The delay may correspond to a quantity of bursts. For example, the delay may indicate two (2) bursts such that the second data may be propagated from the ECC block 465-*b* to the FIFO buffer 410-*c* in a burst that is two (2) bursts after the completion of the first burst. In some cases, the delay for the flow-through ECC automatic mode may be approximately 2.5 nanoseconds. In these cases, the ECC block 465-*b* may generate the indication within 1.5 to two (2) nanoseconds. For example, the system 400-*b* may use additional cycles (e.g., READ clocks corresponding to a burst length) to communicate the second data from the ECC block 465-*b* to the host device after communicating the first data from the I/O logic 485-*b*. The delay may support memory systems with low latency constraints.

In a second example, the mode register controller 415-*b* may indicate for the MUX 425-*b* to propagate data from the I/O logic 485-*b* or the ECC block 465-*b* based on an indication received from the host device. This may be referred to as ECC dedicated mode. Here, the host device may receive an indication of a detected and/or corrected error (e.g., by the error flag 420-*b*). When the host device receives the indication of the detected and/or corrected error, the host device may suspend operation of the system 400-*b* and may indicate to the mode register controller 415-*b* to set the MUX 425-*b* to propagate the second data (e.g., generated by correcting at least one error in the first data) from the ECC block 465-*b* to the FIFO buffer 410-*c*. The host device may indicate for the mode register controller 415-*b* to set the MUX 425-*b* to propagate the second data within a time limit (e.g., within 1.5 nanoseconds). Thus, the data may be directed through the ECC block 465-*b*. Setting the mode register controller 415-*b* to direct data through the ECC block 465-*b* may correspond to disabling the flow-through mode. The host device may repeat the read command (or read commands) corresponding to the indication of the detected and/or corrected error. Because the host device set the mode register controller 415-*b* to disable the flow-through mode, when executing the reread (or rereads), the data may be directed through the ECC block 465-*b*. In some cases, the rereads may include the system 400-*b* rewriting the corrected data to the array 490-*b*.

Additionally or alternatively, the host device may receive an indication of a detected and/or corrected error and not initiate a reread. The host device may correct the error within the first data (e.g., as received from the system 400-*b*) at the host device. In some cases, this may avoid errors introduced by an SEC operation at the system 400-*b* (e.g., an erroneously flipped bit by the ECC block 465-*b*). The host device may determine to continue operating in the first mode (e.g., bypassing the ECC block 465-*b*) or switch the mode register controller 415-*b* to cause the system to operate according to the second mode (e.g., through the ECC block 465-*b*).

The host device may determine whether the system 400-*b* continues to propagate data through the ECC block 465-*b* (e.g., in accordance with the second mode) or switching back to bypassing the ECC block 465-*b* (e.g., in accordance with the first mode). In some cases, the host device may determine a mode based on a section of the array 490-*b* being accessed. For example, the host device may map out sections of the array 490-*b* associated with higher rates of errors (e.g., single-bit errors) than other sections. The host device may determine to switch to the second mode when accessing (e.g., reading) these sections of the array 490-*b*.

The method for adjusting the mode register controller 415-*b* (e.g., adjusting the mode register controller 415-*b* autonomously or based on an indication from the host device) may be non-programmable (e.g., hard-wired or stored in ROM) or OTP (e.g., stored in one or more fuses or anti-fuses or one or more memory OTP memory). In a second example, the method for adjusting the mode register controller 415-*b* may programmable after assembly (e.g., by the host device, by the original equipment manufacturer).

Figure 5:
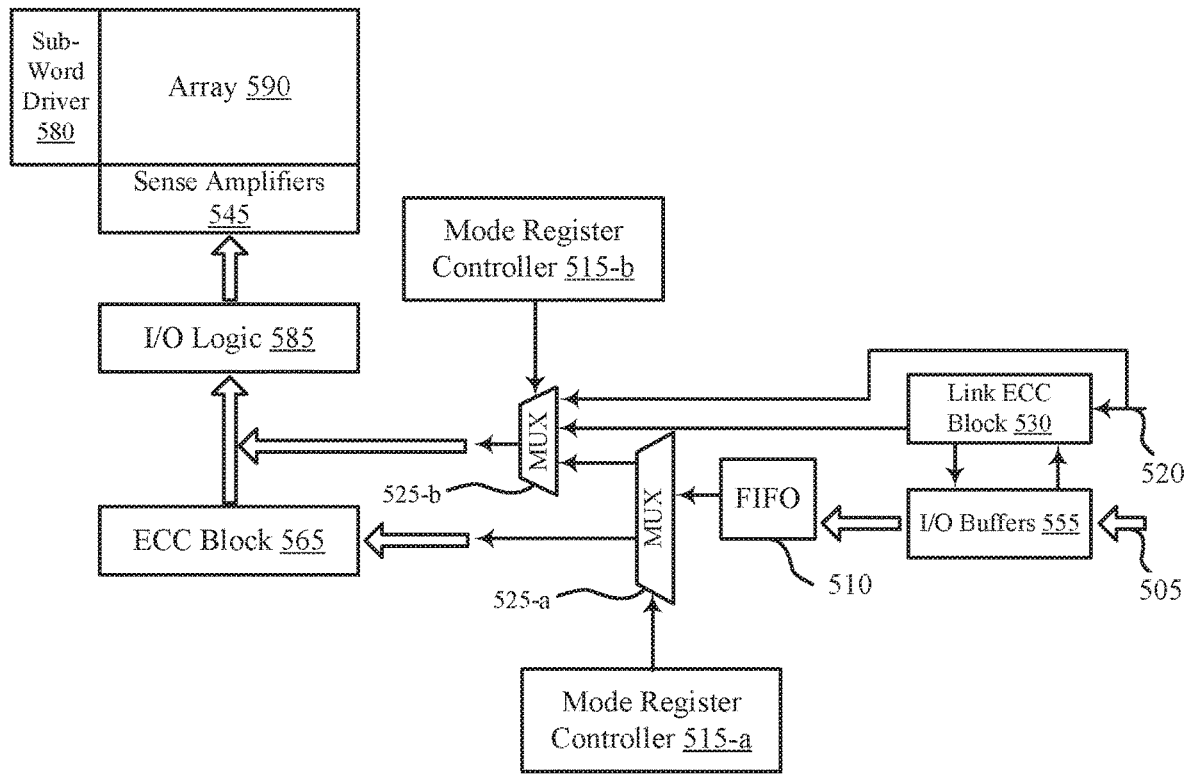

FIG. 5 illustrates an example of a system 500 that supports an error correction memory device with fast data access as disclosed herein. The system 500 may include one or more components as described with reference to FIGS. 1 through 4. For example, the system 500 may include an array 590 which may be an example of one or more of the memory arrays 170 or arrays 395, and 490 as described with reference to FIGS. 1 and 3 through 4; the sense amplifiers 545 which may include aspects of the sense component 245 and the sense amplifiers 345 and 445 as described with reference to FIGS. 2 and 3 through 4; the I/O logic 585 which may include aspects of the I/O logic 385 and 485 as described with reference to FIGS. 3 through 5; the ECC block 565 which may be an example of the ECC blocks 270, 365, and 465 as described with reference to FIGS. 2 through 4; and the I/O buffers 555 may be an example of the input/output 260 or the I/O buffers 355 and 455 as described with reference to FIGS. 2 through 4. The system 500 may also include a link ECC block 530, a FIFO buffer 510, and MUM 525.

System 500 may be coupled to a host device via a first channel 505 and a second channel 520. System 500 may be configured to perform a write operation. The system 500 may receive a write command (e.g., from a host device) including data at the I/O buffers 555 via a first channel 505. The data may be communicated from the I/O buffers 555 to a FIFO buffer 510.

The write command may further include error detection or correction information received by a second channel 520. The second channel 520 may propagate the error detection or correction information to the link ECC block 530. The link ECC block 530 may be used to increase the reliability of the data received by the channel 505. The second channel 520 may also propagate the error detection or correction information to the MUX 525-*b*. The error detection or correction information may comprise one or more SEC ECC bits. SECDED ECC bits, or some other type of ECC bits (e.g., other than SEC or SECDED ECC bits) depending on a mode of ECC operation. The link ECC block 530 may utilize the error detection or correction information to detect and correct single-bit and, in some cases, detect and/or correct double-bit errors in the data received from by the first channel 505. The link ECC block 530 may communicate corrected data to the I/O Buffers 555. The link ECC block 530 may further communicate a manipulated version of the error detection or correction information (e.g., where a bit error is detected in the error detection or correction information) to the MUX 525-*b*.

The I/O buffers 555 may propagate the data to be stored through the ECC block 565 and to the FIFO buffer 510. The FIFO buffer 510 may in turn communicate the data to be stored at the array 590 to the MUX 525-*a*. The mode register controller 515-*a* may determine, based on a mode of operation of the system 500, whether to propagate the data through the MUX 525-*a* to MUX 525-*b* (thus bypassing the ECC block 565) or to the ECC block 565. In some cases, performing the error detection and correction operation at the ECC block 565 may add latency to the write operation. For example, the error detection and correction operation may take several nanoseconds, which may result in a write latency of one or more clock cycles. It may be desirable to decrease the latency associated with write operation. In one example, the system 500 may bypass the ECC block 565 and store the data indicated by the write operation without any corresponding error detection or correction information. But not storing error detection or correction information may decrease the reliability of the system. In another example, the system 500 may bypass the ECC block 565 and store the data and corresponding error correction and detection information generated by a host device. Here, the latency introduced by the ECC block 565 may be bypassed while still maintaining the reliability associated with storing error detection or correction information.

In a first mode of operation the mode register controller 515-*a* adjusts the output of MUX 525-*a* to propagate the data from the FIFO buffer 510 to the ECC block 565. The ECC block 565 may generate second error detection or correction information associated with the data to be stored at the array 590. In some cases, the error detection or correction information may be based on a type of ECC operation performed by the ECC block 565. For example, if the ECC block 565 is performing SEC, the ECC block 565 may generate first error detection or correction information. In another example, if the ECC block 565 is performing SECDED, the ECC block 565 may generate second error detection or correction information different than the first error detection or correction information. In yet another example, the ECC block 565 is performing a different type of ECC operation (e.g., other than SEC or SECDED) and the second error detection or correction information is based on the type of ECC operation. The ECC block 565 may propagate the generated error detection or correction information to the I/O logic 585.

In a second mode of operation, the mode register controller 515-*a* adjusts the output of MUX 525-*a* to propagate the data from the FIFO buffer 510 to the MUX 525-*b*. The MUX 525-*b* may receive the data from the FIFO buffer 510 along with the error detection or correction information. The error detection or correction information may be manipulated error detection information communicated by the link ECC block 530 (e.g., in an event when the link ECC block 530 detects an error in the data received from the host device or error detection or correction information communicated by channel 520 (e.g., if the link ECC block 530 does not detect an error in the data received from the host device). The mode register controller 515-*b* may control the operation of MUX 525-*b* to output the data and one of the error detection or correction information or manipulated error detection or correction information. Thus, the MUX 525-*b* may propagate the data and error detection or correction information to the I/O logic 585.

The second mode of operation may correspond to a mode of operation where the ECC block 565 is bypassed. Instead of generating error detection or correction information, the system 500 may utilize error detection or correction information generated by a host device (e.g., link ECC information). In some cases, performing the error detection and correction operation at the ECC block 565 may add latency to the write operation. In the second mode of operation, the latency introduced by the ECC block 565 may be bypassed while still maintaining the reliability associated with storing error detection or correction information.

The I/O logic 585 may communicate the data and the error detection or correction information to the array 590 (e.g., by the sense amplifiers 545). Based on a location of the array 590 indicated by the write command, the sub-word driver 580 may activate the corresponding location of the array 590 to store the data and the error detection or correction information at the array 590.

FIG. 5 illustrates an example of a process flow 500 that supports an error correction memory device with fast data access as disclosed herein. The process flow 600 may include operations performed by a host device 605, which may be an example of an external memory controller 105 as described with reference to FIG. 1. The process flow 600 may further include operations performed by a memory device (e.g., the memory device 110, the memory dice 160, the memory die 200, or the memory device 310 described with reference to FIGS. 1 through 3, among others) or a component of a memory device such as the device memory controller 155, the local memory controllers 165, the local memory controller 265, the systems 400, or systems 500 as described with reference to FIGS. 1 through 5.

At 615, the memory device 610 may receive a read command from the host device 605. The memory device 610 may include a memory array.

At 620, the memory device 610 may read first data from the memory array based on the read command.

At 625, the memory device 610 may perform an error correction operation on the first data to obtain second data and an indicator of an error in the first data. The error correction operation may correspond to an SEC operation or and SECDED operation.

At 630, the memory device 610 may output the first data to the host device 605 concurrently with performing at least a portion of the error correction operation. That is, the memory device 610 may output the first data while performing the error correction operation on the data. Thus, the memory device 610 may output the first data without latency caused by the error correction operation.

If the error correction operation corresponds to an SEC operation, the error indication may include an indication of a corrected single-bit error within the second data, an indication of an uncorrected error within the second data, an indication of an erroneously flipped bit within the second data, or a combination thereof. If the error correction operation corresponds to an SECDED operation, the error indication may include an indication of a corrected single-bit error within the second data, an indication of a double-bit error detected within the second data, an indication of an uncorrected error within the second data, or an indication of an erroneously flipped bit within the second data, or a combination thereof.

At 635, the memory device 610 may output the indicator of the error to the host device 605. In some cases, the memory device 610 may output the indicator of the error concurrent with performing at least a portion of the error correction operation.

At 640, the memory device 610 may optionally output the second data to the host device 605 based on the error in the first data. In some cases, the memory device 610 may output the second data immediately following or at a determined time after outputting the first data. For example, the memory device 610 may indicate the determined time in the error indication (e.g., output by the memory device at 610). In some other cases, the memory device 610 may not output the second data. In this case, the memory device 610 may receive, from the host device 605, a second read command indicating a reread of the memory array based on outputting the error indication (e.g., at 635). The memory device 610 may read third data from the memory array based on the second read command and perform a second error correction operation on the third data to obtain four data. The memory device 610 may output the fourth data to the host device 605.

Figure 6:
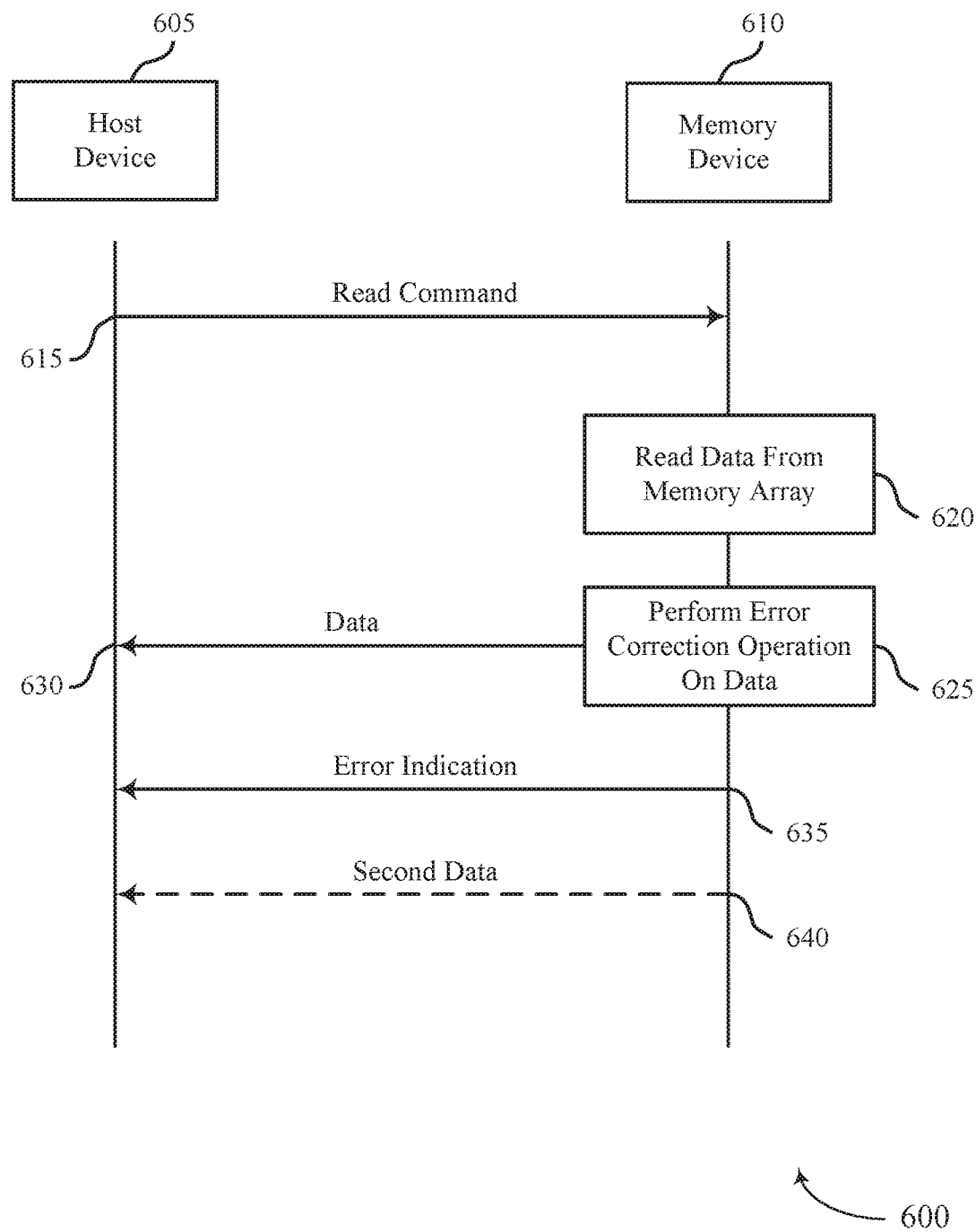
FIGS. 6 and 7 illustrate examples of process flows that support an error correction memory device with fast data access as disclosed herein.

FIG. 6 illustrates an example of a process flow 600 that supports an error correction memory device with fast data access as disclosed herein. The process flow 700 may include operations performed by a host device 705, which may be an example of an external memory controller 105 as described with reference to FIG. 1 or a host device 605 as described with reference to FIG. 6. The process flow 700 may further include operations performed by a memory device (e.g., the memory device 110, the memory dice 160, the memory die 200, the memory device 310, or the memory device 610 as described with reference to FIGS. 1 through 3 and 6, among others) or a component of a memory device such as the device memory controller 155, the local memory controllers 165, the local memory controller 265, the systems 400, or systems 500 as described with reference to FIGS. 1 through 5.

At 715, the memory device 710 may receive, from the host device 705, a write command. The memory device 710 may include a memory array.

At 720, the memory device may receive, from the host device 705, first data and error detection or correction information associated with the write command.

At 725, the memory device 710 may perform an error correction operation, using the received error detection or correction information, on the first data to obtain second data. In some cases, at 725, the memory device 710 may also adjust the error detection or correction information received from the host device 705 based on performing the error correction operation.

At 730, the memory device 710 may optionally generate error correction or detection information based on the second data.

At 735, the memory device 710 may store the second data and error detection or correction information. In some cases, the memory device may store the received error detection or correction information at the memory array based on the write command. Here, the memory device 710 may not generate error correction or detection information. Thus, the memory device 710 may bypass the latency associated with the error correction and detection operation corresponding to generating the error correction or detection information. In some other cases, the memory device may store the adjusted error detection or correction information. Here, the memory device 710 may also bypass the latency associated with the error correction and detection operation corresponding to generating the error correction or detection information. In some other cases (e.g., if the memory device 710 generated the error correction or detection information at 730), the memory device may store the generated error correction or detection information. In some cases, the memory device 710 may store received error detection or correction information during the execution of one write operation, adjusted error detection or correction information during the execution of another write operation, and generated error detection or correction information during the execution of a third write operation.

Figure 7:
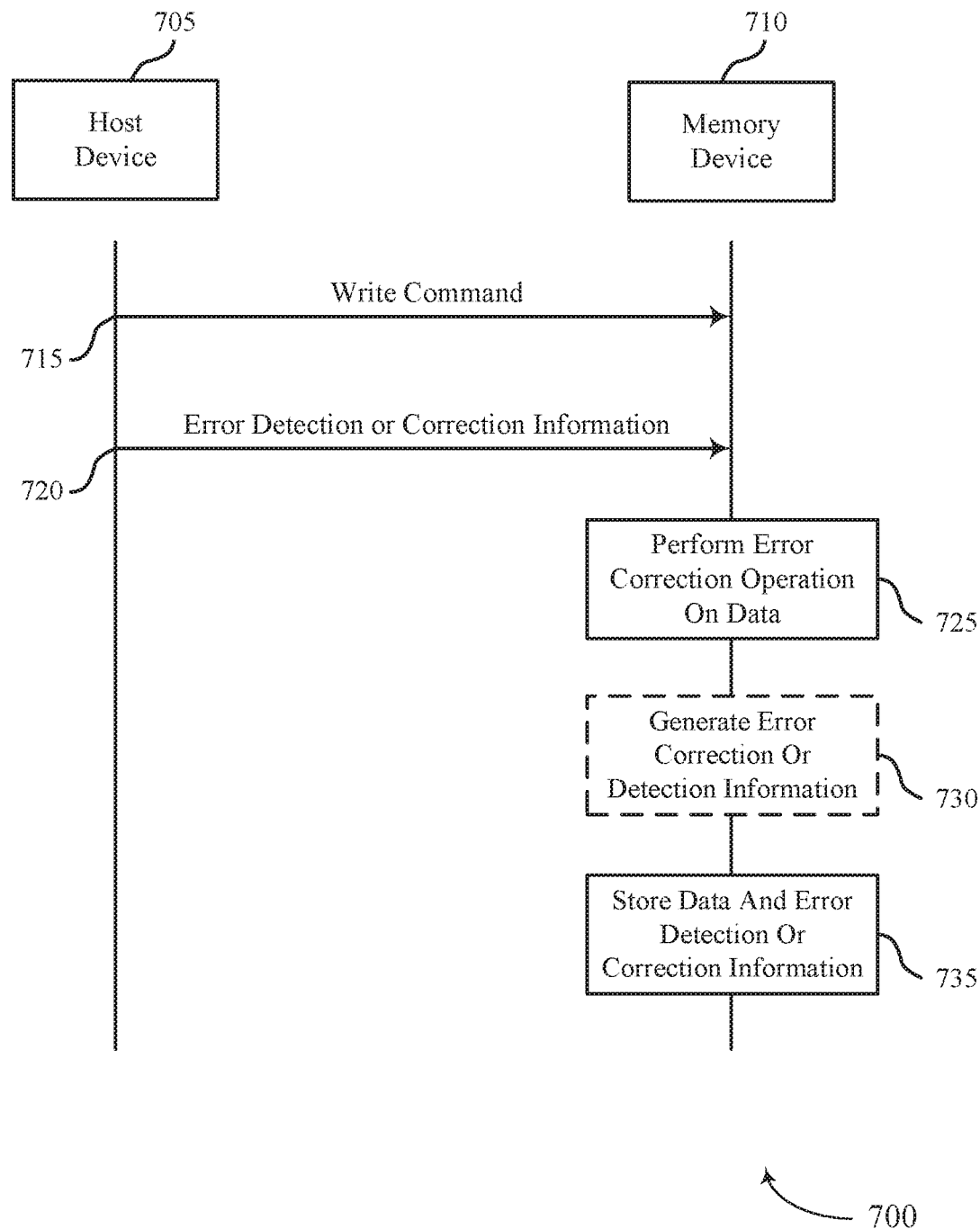

FIG. 7 shows a block diagram 700 of a memory device 705 that supports an error correction memory device with fast data access in accordance with examples as disclosed herein. The memory device 705 may be an example of aspects of a memory device as described with reference to FIGS. 1, 3, 6, and 7. The memory device 705 may include a read command receiver 710, a data reading manager 715, an error correction component 720, an output manager 725, a write command receiver 730, a data receiver 735, a data storage manager 740, and an error information generator 745. Each of these modules may communicate, directly or indirectly, with one another (e.g., via one or more buses).

The read command receiver 710 may receive, at a memory device including a memory array, a read command from a host device. The read command receiver 710 may receive, from the host device, a second read command indicating a reread of the memory array based on outputting the indicator of the error to the host device.

The data reading manager 715 may read first data from the memory array based on the read command. In some examples, the data reading manager 715 reads third data from the memory array based on the second read command.

The error correction component 720 may perform an error correction operation on the first data to obtain second data and an indicator of an error in the first data. In some examples, the error correction component 720 performs a second error correction operation on the third data to obtain fourth data. In some cases, the error correction operation corresponds to an SEC operation. Here, the indicator of the error includes an indication of a corrected single-bit error within the second data, an indication of an uncorrected error within the second data, an indication of an erroneously flipped bit within the second data, or a combination thereof. In some other cases, the error correction operation corresponds to an SECDED operation. Here, the indicator of the error includes an indication of a corrected single-bit error within the second data, an indication of a double-bit error detected within the second data, an indication of an uncorrected error within the second data, or an indication of an erroneously flipped bit within the second data, or a combination thereof.

The output manager 725 may output the first data and the indicator of the or to the host device concurrent with performing at least a portion of the error correction operation. In some examples, the output manager 725 outputs the second data at a determined time after outputting the first data based on the error in the first data. In some cases, the output manager 725 outputs the fourth data to the host device.

The write command receiver 730 may receive, from a host device at a memory device including a memory array, a write command (e.g., a first write command). In some examples, the write command receiver 730 receives, at the memory device, a second write command from the host device.

The data receiver 735 may receive, from the host device, first data and error detection or correction information associated with the first write command. In some examples, the data receiver 735 receives, from the host device, third data and second error correction and detection information based on the second write command.

The error correction component 720 may perform an error correction operation using the received error correction and detection information (e.g., associated with the first write command). In some cases, the error correction component 720 adjusts the error detection or correction information based on performing the error correction operation. In some examples, the error correction component 720 performs a second error correction operation (e.g., corresponding to the second write command), using the second error correction and detection information, on the third data to obtain fourth data. The error correction component 720 may generate, at the memory device, a third error correction and detection information based on the fourth data.

The data storage manager 740 may store the second data (e.g., obtained by performing the error correction operation on the data associated with the first write command) and the received error detection or correction information at the memory array based on the write command. In some examples, the data storage manager 740 may store the fourth data (e.g., obtained by performing the error correction operation on the data associated with the second write command) and the third error correction and detection information at the memory array based on the generating. In some cases, the data storage manager 740 stores the adjusted error detection or correction information at the memory array.

The read command receiver 710 may receive, at the memory device, a read command from the host device. The data reading manager 715 may read the second data and the error detection or correction information from the memory array based on the read command. In some examples, the error correction component 720 performs an error correction operation, using the received error detection or correction information, on the first data to obtain second data.

Figure 8:
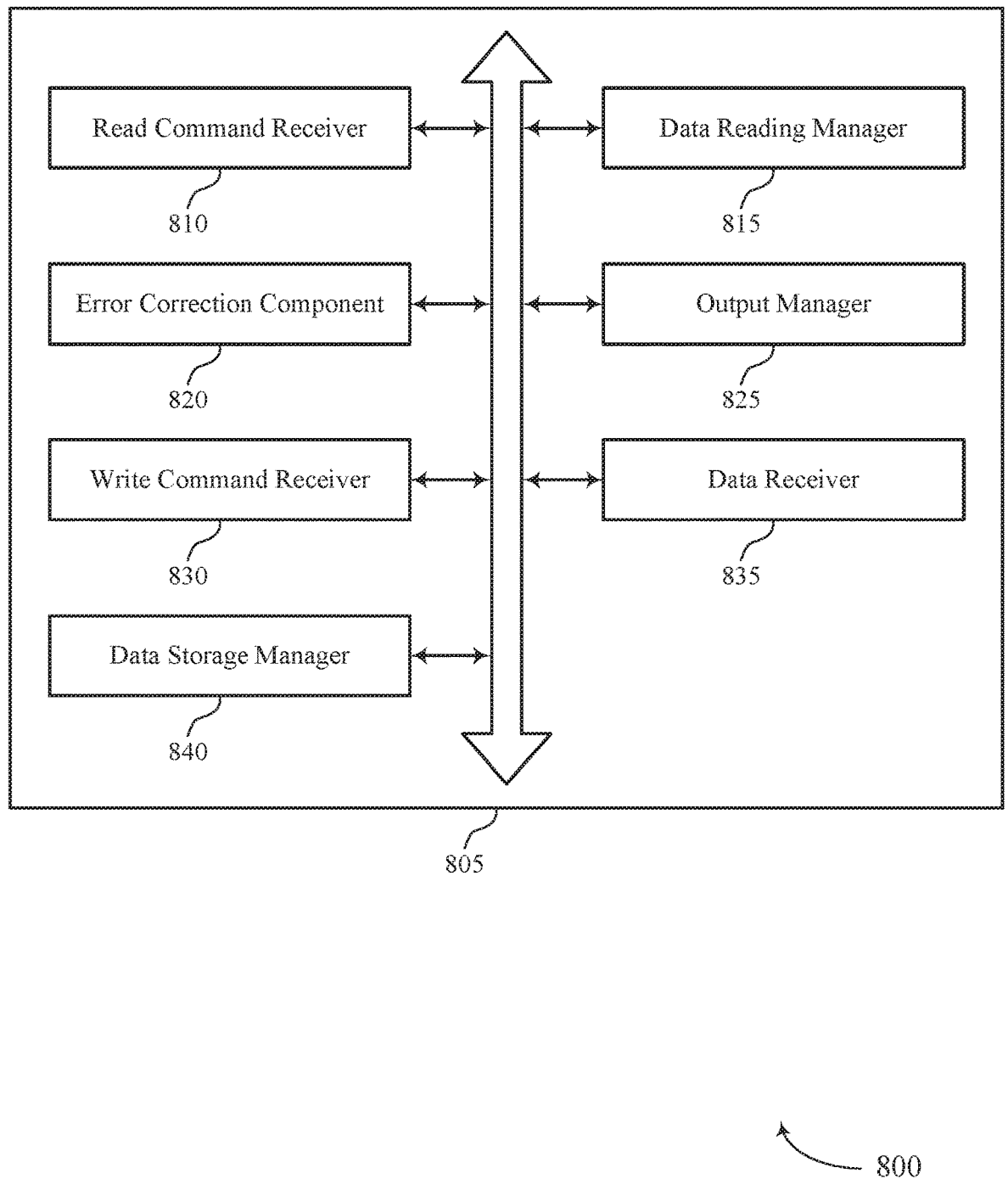
FIG. 8 shows a block diagram of an error correction memory device with fast data access as disclosed herein.

FIG. 8 shows a flowchart illustrating a method or methods 800 that supports an error correction memory device with fast data access as disclosed herein. The operations of method 800 may be implemented by a memory device (e.g., memory device 110, memory device 310, and memory device 610 as disclosed with reference to FIGS. 1, 3, and 6) and/or a system (e.g., system 500), or one or more components. For example, the operations of method 800 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 805, the memory device may receive, at a memory device including a memory array, a read command from a host device. The operations of 805 may be performed according to the methods described herein. In some examples, aspects of the operations of 805 may be performed by a read command receiver as described with reference to FIG. 7.

At 810, the memory device may read first data from the memory array based on the read command. The operations of 810 may be performed according to the methods described herein. In some examples, aspects of the operations of 810 may be performed by a data reading manager as described with reference to FIG. 7.

At 815, the memory device may perform an error correction operation on the first data to obtain second data and an indicator of an error in the first data. The operations of 815 may be performed according to the methods described herein. In some examples, aspects of the operations of 815 may be performed by an error correction component as described with reference to FIG. 7.

At 820, the memory device may output the first data and the indicator of the error to the host device concurrent with performing at least a portion of the error correction operation. The operations of 820 may be performed according to the methods described herein. In some examples, aspects of the operations of 820 may be performed by an output manager as described with reference to FIG. 7.

In some examples, an apparatus as described herein may perform a method or methods, such as the method 800. The apparatus may include features, means, or instructions (e.g., a non-transitory computer-readable medium storing instructions executable by a processor) for receiving, at a memory device including a memory array, a read command from a host device, reading first data from the memory array based on the read command, performing an error correction operation on the first data to obtain second data and an indicator of an error in the first data, and outputting the first data and the indicator of the error to the host device concurrent with performing at least a portion of the error correction operation.

Some examples of the method 800 and the apparatus described herein may further include operations, features, means, or instructions for outputting the second data at a determined time after outputting the first data based on the error in the first data.

Some examples of the method 800 and the apparatus described herein may further include operations, features, means, or instructions for receiving, from the host device, a second read command indicating a reread of the memory array based on outputting the indicator of the error to the host device, reading third data from the memory array based on the second read command, performing a second error correction operation on the third data to obtain fourth data, and outputting the fourth data to the host device.

In some examples of the method 800 and the apparatus described herein, the error correction operation corresponds to an SEC operation.

In some examples of the method 800 and the apparatus described herein, the indicator of the error includes an indication of a corrected single-bit error within the second data, an indication of an uncorrected error within the second data, an indication of an erroneously flipped bit within the second data, or a combination thereof.

In some examples of the method 800 and the apparatus described herein, the error correction operation corresponds to an SECDED operation.

In some examples of the method 800 and the apparatus described herein, the indicator of the error includes an indication of a corrected single-bit error within the second data, an indication of a double-bit error detected within the second data, an indication of an uncorrected error within the second data, or an indication of an erroneously flipped bit within the second data, or a combination thereof.

Figure 9:
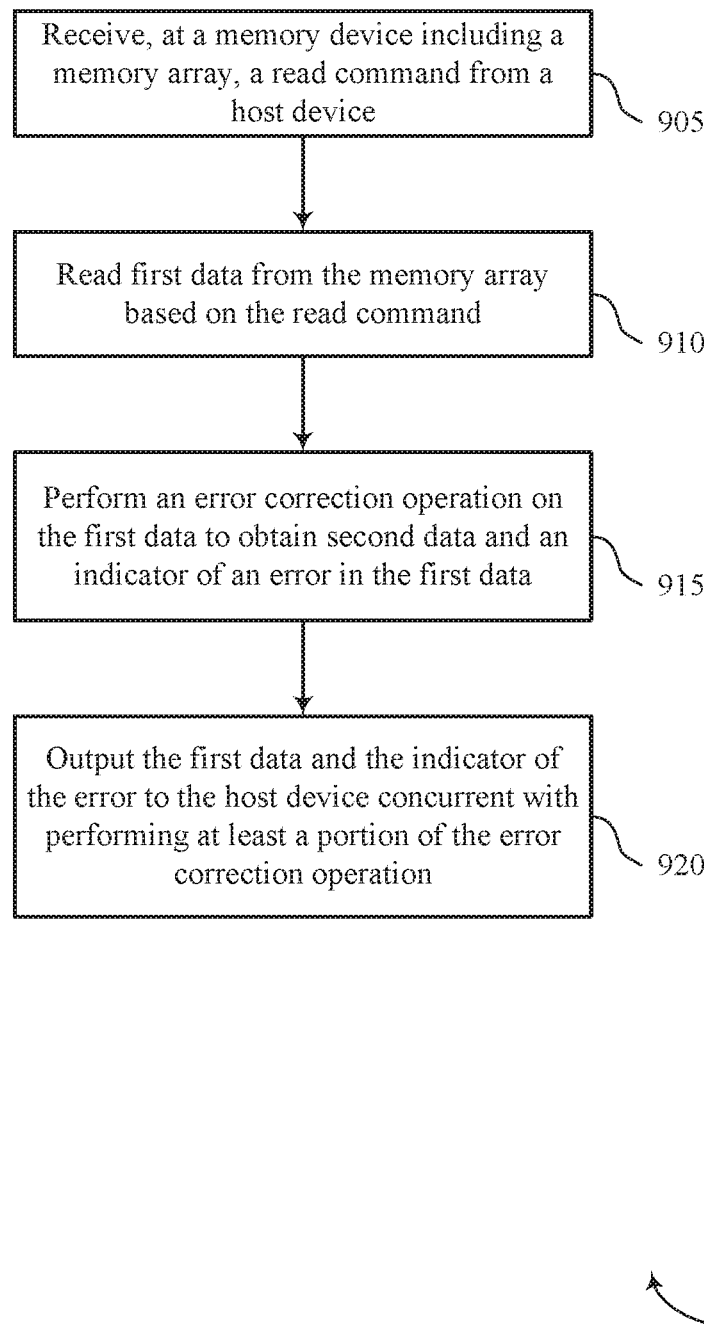
FIGS. 9, 10 and 11 show flowcharts illustrating a method or methods that support an error correction memory device with fast data access as disclosed herein.

FIG. 9 shows a flowchart illustrating a method or methods 900 that supports an error correction memory device with fast data access in accordance with examples as disclosed herein. The operations of method 900 may be implemented by a memory device or its components as described herein. For example, the operations of method 900 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 905, the memory device may receive, at a memory device including a memory array, a read command from a host device. The operations of 905 may be performed according to the methods described herein. In some examples, aspects of the operations of 905 may be performed by a read command receiver as described with reference to FIG. 7.

At 910, the memory device may read first data from the memory array based on the read command. The operations of 910 may be performed according to the methods described herein. In some examples, aspects of the operations of 910 may be performed by a data reading manager as described with reference to FIG. 7.

At 915, the memory device may perform an error correction operation on the first data to obtain second data and an indicator of an error in the first data. The operations of 915 may be performed according to the methods described herein. In some examples, aspects of the operations of 915 may be performed by an error correction component as described with reference to FIG. 7.

At 920, the memory device may output the first data and the indicator of the error to the host device concurrent with performing at least a portion of the error correction operation. The operations of 920 may be performed according to the methods described herein. In some examples, aspects of the operations of 920 may be performed by an output manager as described with reference to FIG. 7.

At 925, the memory device may output the second data at a determined time after outputting the first data based on the error in the first data. The operations of 925 may be performed according to the methods described herein. In some examples, aspects of the operations of 925 may be performed by an output manager as described with reference to FIG. 7.

Figure 10:
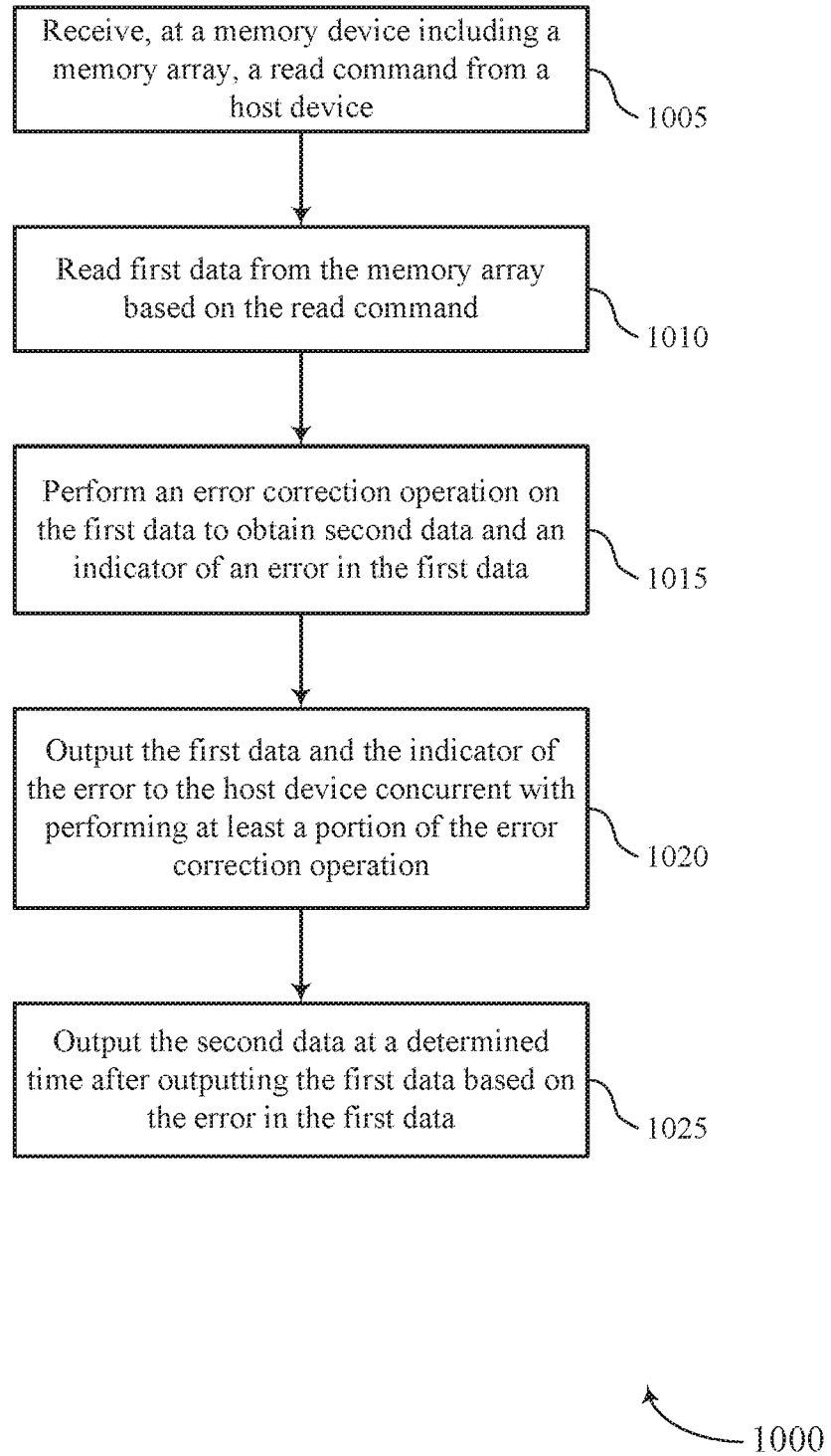
Figure 11:
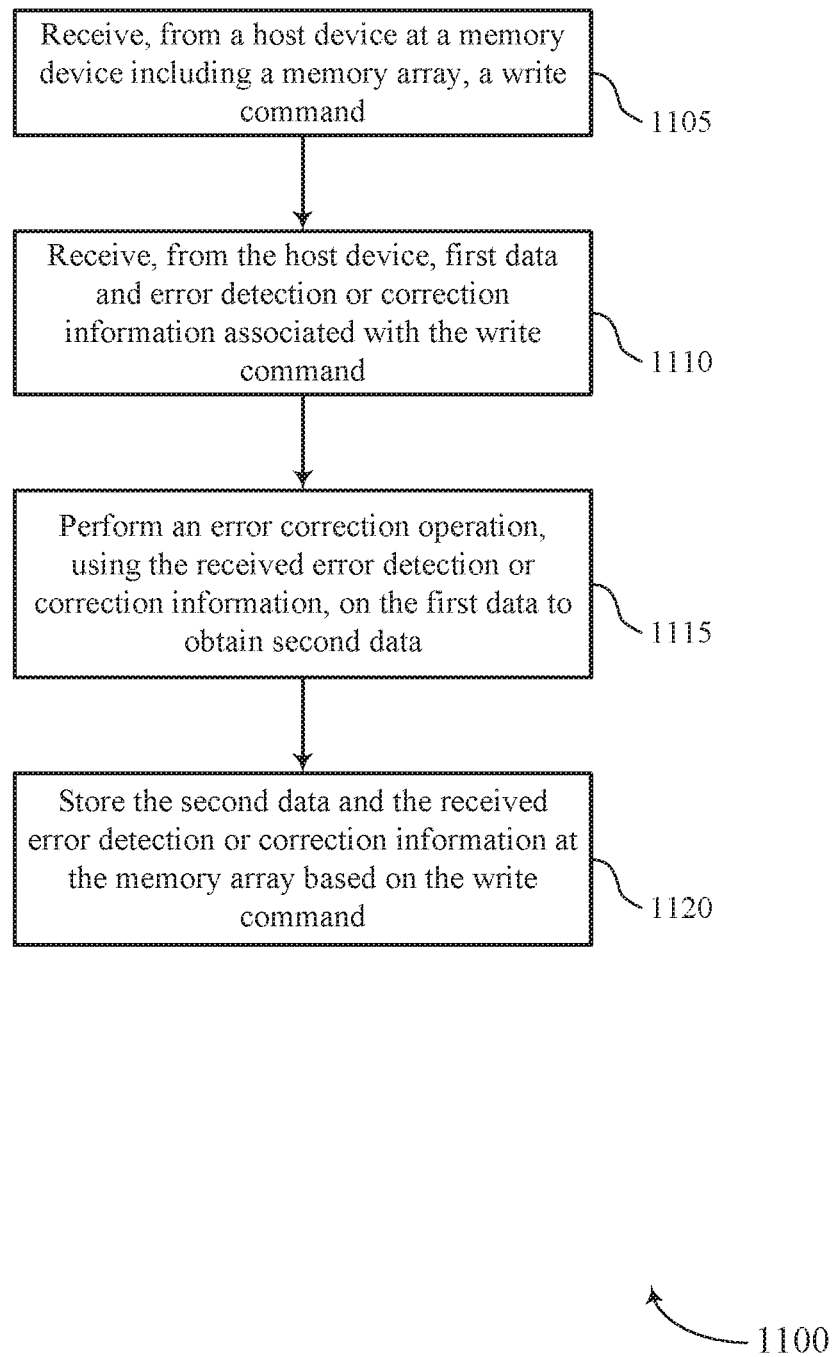

FIG. 10 shows a flowchart illustrating a method or methods 1000 that supports an error correction memory device with fast data access in accordance with examples as disclosed herein. The operations of method 1000 may be implemented by a memory device or its components as described herein. For example, the operations of method 1000 may be performed by a memory device as described with reference to FIG. 7. In some examples, a memory device may execute a set of instructions to control the functional elements of the memory device to perform the described functions. Additionally or alternatively, a memory device may perform aspects of the described functions using special-purpose hardware.

At 1005, the memory device may receive, from a host device at a memory device including a memory array, a write command. The operations of 1005 may be performed according to the methods described herein. In some examples, aspects of the operations of 1005 may be performed by a write command receiver as described with reference to FIG. 7.

At 1010, the memory device may receive, from the host device, first data and error detection or correction information associated with the write command. The operations of 1010 may be performed according to the methods described herein. In some examples, aspects of the operations of 1010 may be performed by a data receiver as described with reference to FIG. 7.

At 1015, the memory device may perform an error correction operation, using the received error detection or correction information, on the first data to obtain second data. The operations of 1015 may be performed according to the methods described herein. In some examples, aspects of the operations of 1015 may be performed by an error correction component as described with reference to FIG. 7.

At 1020, the memory device may store the second data and the received error detection or correction information at the memory array based on the write command. The operations of 1020 may be performed according to the methods described herein. In some examples, aspects of the operations of 1020 may be performed by a data storage manager as described with reference to FIG. 7.

In some examples, an apparatus as described herein may perform a method or methods, such as the method 1000. The apparatus may include features, means, or instructions (e.g., a non-transitory computer-readable medium storing instructions executable by a processor) for receiving, from a host device at a memory device including a memory array, a write command, receiving, from the host device, first data and error detection or correction information associated with the write command, performing an error correction operation, using the received error detection or correction information, on the first data to obtain second data, and storing the second data and the received error detection or correction information at the memory array based on the write command.

Some examples of the method 1000 and the apparatus described herein may further include operations, features, means, or instructions for receiving, at the memory device, a read command from the host device, reading the second data and the error detection or correction information from the memory array based on the read command, and performing a second error correction operation using the received error correction and detection information.

Some examples of the method 1000 and the apparatus described herein may further include operations, features, means, or instructions for receiving, at the memory device, a second write command from the host device, receiving, from the host device, third data and second error correction and detection information based on the second write command, performing a second error correction operation, using the second error correction and detection information, on the third data to obtain fourth data, generating, at the memory device, a third error correction and detection information based on the fourth data, and storing the fourth data and the third error correction and detection information at the memory array based on the generating.

Some examples of the method 1000 and the apparatus described herein may further include operations, features, means, or instructions for adjusting the error detection or correction information based on performing the error correction operation, and storing the adjusted error detection or correction information at the memory array.

It should be noted that the methods described above describe possible implementations, and that the operations and the steps may be rearranged or otherwise modified and that other implementations are possible. Furthermore, aspects front two (2) or more of the methods may be combined.

In some examples, an apparatus corresponding to an error correction memory device with fast data access may perform aspects of the function described herein using general- or special-purpose hardware. The apparatus may include an array of memory cells that each include capacitive storage elements, an interface configured to receive a read command from a host device, a first circuit configured to read first data front the array based on the read command, and a second circuit coupled with the first circuit and configured to perform an error correction operation on the first data to obtain second data and an indicator of an error in the first data, where the interface is configured to communicate, to the host device, the first data and an indicator of the error in the first data.

In some examples, the second circuit may be configured to perform the error correction operation on the first data concurrently with the interface communicating the first data to the host device.

In some cases, the apparatus may further include a first buffer coupled with the first circuit and configured to receive the first data from the first circuit, a second buffer coupled with the a second buffer coupled with the second circuit and configured to receive the second data from the error detection circuit, and a multiplexer coupled with the first buffer, the second buffer, and the interface, the multiplexer configured to output the first data from the first buffer or the second data from the second buffer to the interface based on the error detection operation.

In some instances, the apparatus may further include a buffer coupled with the interface and configured to receive the first data or the second data, store the first data or the second data at the buffer, and serially output subsets of the stored first data or second data to the interface.

In some cases, the apparatus may further include a register configured to indicate output of the first data or the second data, where the buffer is configured to receive the first data form the first circuit or the second data from the second circuit based on a value stored in the register.

In some cases, the apparatus may further include a memory control configured to couple the buffer with the interface.

In some examples, the second circuit may be configured to perform an SEC operation or an SECDED operation.

In some instances, the interface may be configured to communicate the first data or the second data by a first channel and the indicator of the error by a second channel.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, bus may have a variety of bit widths.

As used herein, the term "virtual ground" refers to a node of an electrical circuit that is held at a voltage of approximately zero volts (0V) but that is not directly coupled with ground. Accordingly, the voltage of a virtual ground may temporarily fluctuate and return to approximately 0V at steady state. A virtual ground may be implemented using various electronic circuit elements, such as a voltage divider consisting of operational amplifiers and resistors. Other implementations are also possible. "Virtual grounding" or "virtually grounded" means connected to approximately 0V.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two (2) components separated by a switch that is positioned between the components are isolated from each other when the switch is open. When a controller isolates two (2) components from one another, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three (3) terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or arty combination thereof.

The various illustrative blocks and modules described in connection with the disclosure herein may be implemented or performed with a general-purpose processor, a DSP, an ASIC an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   receiving, at a memory device comprising a memory array, a read command from a host device external to the memory device;
   reading first data and an error control code corresponding to the first data from the memory array to an error control circuit via a first data path and to a buffer via a second data path which bypasses the error control circuit based at least in part on the read command;

identifying, by the error control circuit, an error in the first data based at least in part on performing an error correction operation on the first data using the error control code;
outputting, by the buffer, the first data corresponding to the error control code and comprising the error to the host device concurrent with performing at least a portion of the error correction operation using the error control code; and
outputting an indicator of the error to the host device based at least in part on the error correction operation identifying the error in the first data.

2. The method of claim 1, further comprising:
obtaining second data based at least in part on performing the error correction operation on the first data; and
outputting the second data at a determined time after outputting the first data based at least in part on the error in the first data.

3. The method of claim 1, further comprising:
receiving, from the host device, a second read command indicating a reread of the memory array based at least in part on outputting the indicator of the error to the host device;
reading third data from the memory array based at least in part on the second read command;
performing a second error correction operation on the third data to obtain fourth data; and
outputting the fourth data to the host device.

4. The method of claim 1, wherein the error correction operation corresponds to a single error correction (SEC) operation.

5. The method of claim 4, further comprising:
obtaining second data based at least in part on performing the error correction operation on the first data, wherein the indicator of the error comprises an indication of a corrected single-bit error within the second data, an indication of an uncorrected error within the second data, an indication of an erroneously flipped bit within the second data, or a combination thereof.

6. The method of claim 1, wherein the error correction operation corresponds to a single error correction double error detection (SECDED) operation.

7. The method of claim 1, further comprising:
obtaining second data based at least in part on performing the error correction operation on the first data, wherein the indicator of the error comprises an indication of a corrected single-bit error within the second data, an indication of a double-bit error detected within the second data, an indication of an uncorrected error within the second data, or an indication of an erroneously flipped bit within the second data, or a combination thereof.

8. An apparatus, comprising:
an array of memory cells of a memory device that each comprise capacitive storage elements;
an interface configured to receive a read command from a host device external to the memory device;
a first circuit configured to read first data and an error control code corresponding to the first data from the array to a second circuit via a first data path and to a buffer via a second data path which bypasses the second circuit based at least in part on the read command; and
the second circuit coupled with the first circuit and configured to identify an error in the first data based at least in part on performing an error correction operation on the first data using the error control code,
wherein the interface is further configured to:
communicate, to the host device via the buffer, the first data corresponding to the error control code and comprising the error concurrent with the second circuit performing at least a portion of the error correction operation using the error control code; and
communicate, to the host device, an indicator of the error based at least in part on the error correction operation identifying the error in the first data.

9. The apparatus of claim 8, wherein the second circuit is further configured to obtain second data based at least in part on performing the error correction operation, the apparatus further comprising:
a first buffer coupled with the first circuit and configured to receive the first data from the first circuit;
a second buffer coupled with the second circuit and configured to receive the second data from the second circuit; and
a multiplexer coupled with the first buffer, the second buffer, and the interface, the multiplexer configured to output the first data from the first buffer or the second data from the second buffer to the interface based at least in part on the error correction operation.

10. The apparatus of claim 8, wherein the second circuit is further configured to obtain second data based at least in part on performing the error correction operation, the apparatus further comprising a buffer coupled with the interface and configured to:
receive data comprising the first data or the second data;
store the received data at the buffer; and
serially output subsets of the received data to the interface.

11. The apparatus of claim 10, further comprising a register configured to indicate output of the first data or the second data, wherein the buffer is configured to receive the first data from the first circuit or the second data from the second circuit based at least in part on a value stored in the register.

12. The apparatus of claim 11, further comprising:
a memory controller configured to change the value stored in the register based at least in part on the error in the first data.

13. The apparatus of claim 10, further comprising:
a multiplexer that is configured to couple the buffer with the interface.

14. The apparatus of claim 8, wherein the second circuit is configured to perform a single error correction (SEC) operation or a single error correction double error detection (SECDED) operation.

15. The apparatus of claim 8, wherein:
the second circuit is further configured to obtain second data based at least in part on performing the error correction operation; and
the interface is configured to communicate the first data or the second data by a first channel and the indicator of the error by a second channel.

* * * * *